(12) United States Patent
Kim

(10) Patent No.: US 11,050,438 B2
(45) Date of Patent: Jun. 29, 2021

(54) MEMORY CONTROLLER

(71) Applicant: SK hynix Inc., Icheon-si (KR)

(72) Inventor: Dae Sung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 9 days.

(21) Appl. No.: 16/596,578

(22) Filed: Oct. 8, 2019

(65) Prior Publication Data

US 2020/0266830 A1 Aug. 20, 2020

(30) Foreign Application Priority Data

Feb. 14, 2019 (KR) .......................... 10-2019-0017439

(51) Int. Cl.
| | | |
|---|---|---|
| H03M 13/11 | (2006.01) | |
| H03M 13/00 | (2006.01) | |
| H03M 13/39 | (2006.01) | |
| G06F 13/16 | (2006.01) | |

(52) U.S. Cl.
CPC ..... *H03M 13/1105* (2013.01); *G06F 13/1668* (2013.01); *H03M 13/118* (2013.01); *H03M 13/3927* (2013.01)

(58) Field of Classification Search
None
See application file for complete search history.

(56) References Cited

U.S. PATENT DOCUMENTS

| | | | | |
|---|---|---|---|---|
| 8,713,411 B2* | 4/2014 | Kong | .................... | H03M 13/03 |
| | | | | 714/774 |
| 8,996,969 B2 | 3/2015 | Bolotov et al. | | |
| 9,602,141 B2* | 3/2017 | Zhang | ................ | H03M 13/1102 |
| 10,445,175 B2* | 10/2019 | Ha | ....................... | G06F 11/1012 |

FOREIGN PATENT DOCUMENTS

| | | |
|---|---|---|
| KR | 10-1394596 | 5/2014 |
| KR | 10-2018-0027803 | 3/2018 |

* cited by examiner

*Primary Examiner* — Phung M Chung
(74) *Attorney, Agent, or Firm* — Perkins Coie LLP

(57) ABSTRACT

A memory controller is provided to include an error correction encoder and an error correction decoder. The error correction encoder is configured to encode a message at a second code rate and generate a codeword including a message part, a first parity part, and a second parity part. The error correction decoder is in communication with the error correction encoder and configured to perform at least one of i) first error correction decoding operation at a first code rate greater than the second code rate based on a first parity check matrix and first read values or ii) second error correction decoding operation at the second code rate based on a second parity check matrix and second read values. The first read values correspond to a partial codeword including the message part and the first parity part, and the second read values correspond to an entire codeword.

20 Claims, 29 Drawing Sheets

FIG. 15

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | −4 | +4 | | | | | | |
| 3 | −4 | −2 | +4 | | | | | |
| 4 | −4 | −2 | +2 | +4 | | | | |
| 5 | −4 | −3 | −2 | +2 | +4 | | | |
| 6 | −4 | −3 | −2 | −1 | +2 | +4 | | |
| 7 | −4 | −3 | −2 | −1 | +1 | +2 | +4 | |
| 8 | −4 | −3 | −2 | −1 | +1 | +2 | +3 | +4 |

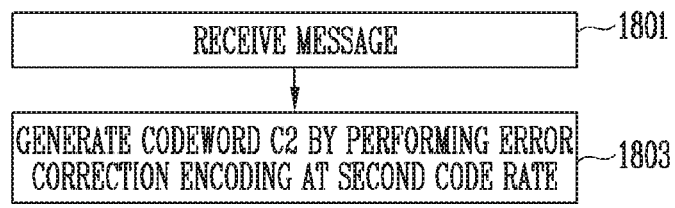
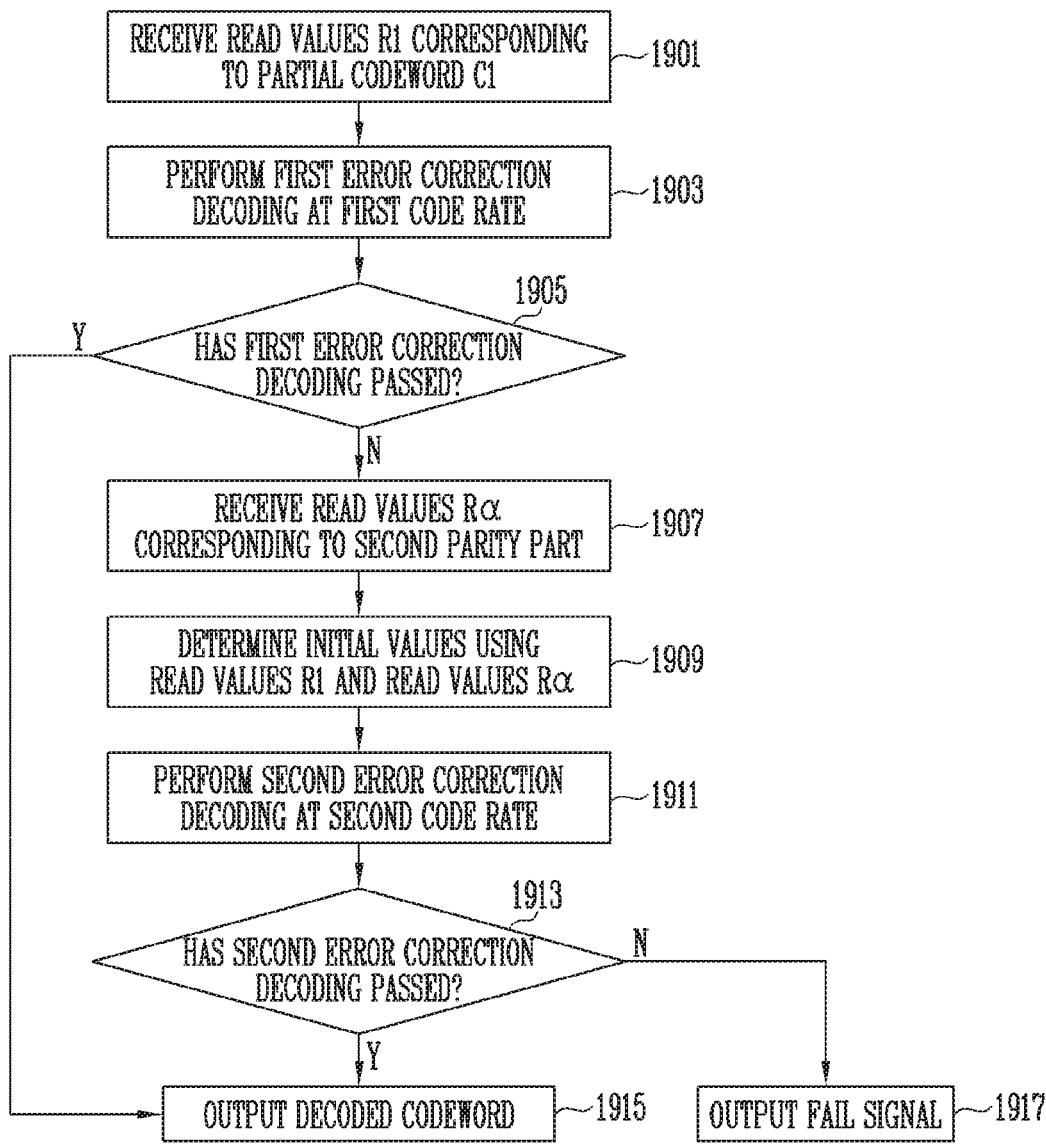

MEMORY CONTROLLER

CROSS-REFERENCE TO RELATED APPLICATION

This patent document claims priority to the Korean patent application number 10-2019-0017439 filed on Feb. 14, 2019, which is incorporated herein by reference in its entirety for all purposes.

TECHNICAL FIELD

The technology and implementations disclosed in this patent document generally relate to a memory controller, and more particularly, to a memory controller that can perform error correction encoding and error correction decoding.

BACKGROUND

A memory system may include a storage media that stores data on memory devices therein either temporarily or persistently. In order to control errors in data that could have occurred as a result of interferences between adjacent memory cells or any data corruption occurring during writing, reading, transmission, or processing, the memory system may use error correction techniques such as error correction encoding and decoding to ensure data reliability. The error correction techniques may be implemented in the form of hardware and/or software. For example, circuitry for error correction may perform encoding and decoding in the memory system using an error-correction code.

A low density parity check (LDPC) code has performance exceeding other traditional error correction code techniques and has been widely used in storage and other systems. With its iterative decoding scheme, the LDPC coding may improve error correction performance (e.g., error correction capability per bit) as the code length is increased, without increasing computational complexity per bit.

SUMMARY

The technology disclosed in this patent document can be implemented in various embodiments to provide a memory controller that can vary a code rate when error correction decoding is performed.

An embodiment of the disclosed technology may provide a memory controller. The memory controller may include an error correction encoder configured to encode a message at a second code rate and generate a codeword including a message part, a first parity part, and a second parity part, and an error correction decoder in communication with the error correction encoder and configured to perform at least one of i) first error correction decoding operation at a first code rate greater than the second code rate based on a first parity check matrix and first read values or ii) second error correction decoding operation at the second code rate based on a second parity check matrix and second read values, wherein the first read values correspond to a partial codeword including the message part and the first parity part, and the second read values correspond to an entire codeword.

An embodiment of the disclosed technology may provide a memory controller. The memory controller may include an error correction encoder configured to perform first error correction encoding operation on messages at a second code rate and generate a plurality of codewords including a target codeword, each codeword including a message part, a first parity part, and a second parity part, the error correction encoder further configured to perform second error correction encoding on second parity parts of the plurality of codewords and generate a parity codeword corresponding to the plurality of codewords, and an error correction decoder in communication with the error correction encoder and configured to perform at least one of first error correction decoding at a first code rate greater than the second code rate or second error correction decoding at the second code rate, wherein the first error correction decoding is performed based on a first parity check matrix and log likelihood ratio (LLR) values corresponding to a partial codeword of the target codeword, the partial codeword including the message part and the first parity part, and wherein the second error correction decoding is performed based on a second parity check matrix and LLR values corresponding to an entire target codeword.

BRIEF DESCRIPTION OF THE DRAWINGS

FIG. 15 is an example diagram for explaining a lookup table.

FIG. 18 is a flowchart illustrating an example process in which the error correction circuit of FIG. 10 performs error correction encoding.

FIG. 19 is a flowchart illustrating an example process in which the error correction circuit of FIG. 10 performs error correction decoding.

DETAILED DESCRIPTION

Advantages and features of the disclosed technology, and methods for achieving the same will be cleared with reference to exemplary embodiments described later in detail together with the accompanying drawings. The disclosed technology is not limited to the following embodiments but embodied in other forms.

Figure 1:
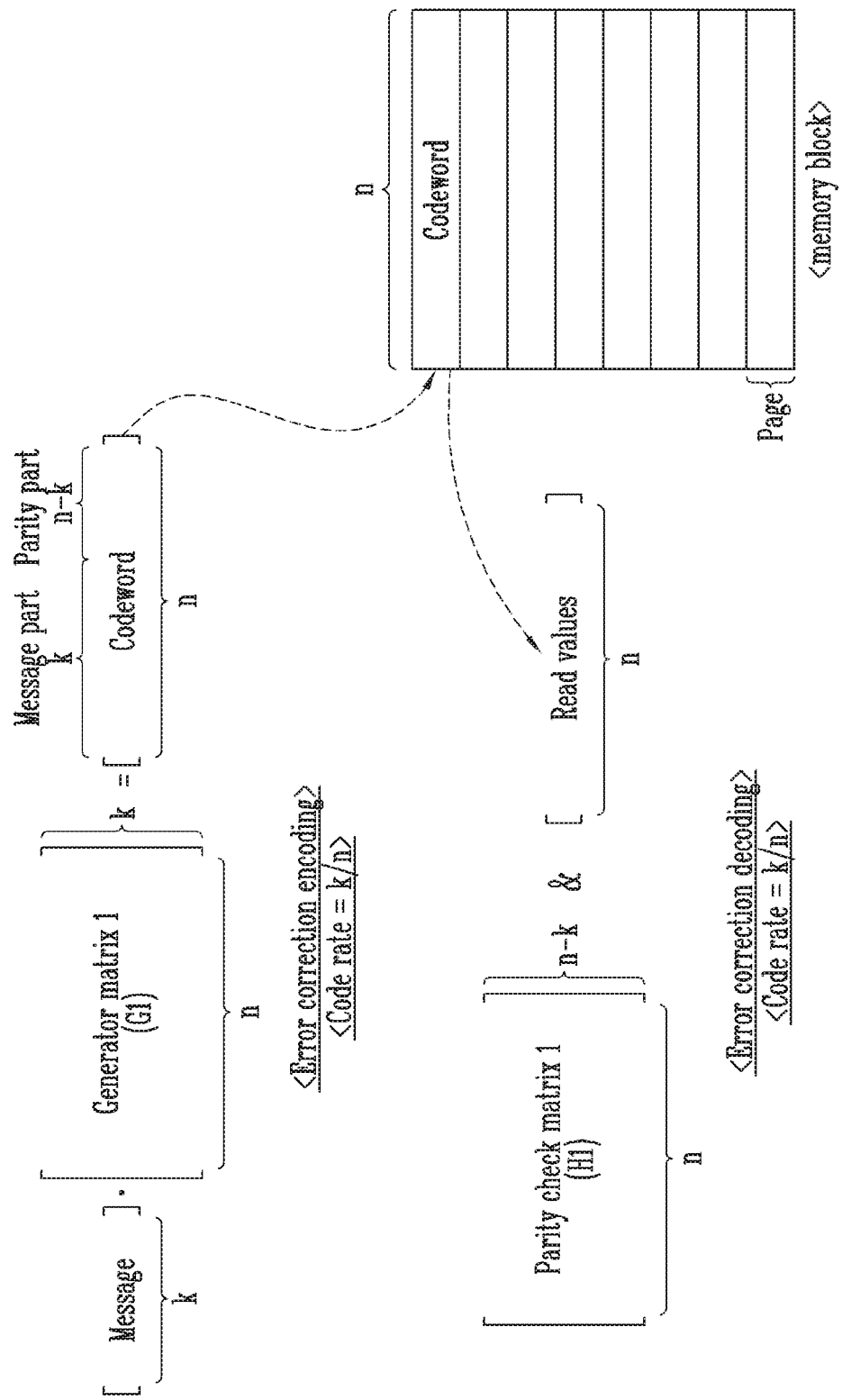
FIG. 1 is a diagram illustrating an example of a case where error correction encoding and error correction decoding are performed using a first code rate.

FIG. 1 is a diagram illustrating an example of a case where error correction encoding and error correction decoding are performed using a first code rate.

FIG. 1 shows an example of a case where error correction encoding is performed using a first generator matrix (generator matrix 1) G1. In this example, the first generator matrix G1 is a generator matrix corresponding to a first code rate of k/n. In accordance with an embodiment, error correction encoding may also be performed using a first parity check matrix (parity check matrix 1) H1 corresponding to the first generator matrix G1, instead of the first generator matrix G1.

When error correction encoding is performed, a codeword having a bit length of n, i.e., an n-bit codeword, may be generated based on a k-bit message and a first generator matrix (generator matrix 1) G1 having a k×n size. The n-bit codeword may include a k-bit message part and an n−k-bit parity part. Here, n and k may be natural numbers.

In an embodiment, assuming that the memory system is designed to store data in units of pages included in a memory block and that a single page has an n-bit length, the n-bit codeword may be stored in a single page.

In an embodiment, assuming that the memory system is designed to store data in units of chunks included in a page and that a single chunk has an n-bit length, the n-bit codeword may be stored in a single chunk.

When error correction decoding is performed, n-bit read values corresponding to a single codeword may be acquired from a single page or chunk. During error correction decoding, error correction decoding may be performed based on the first parity check matrix H1 and the n-bit read values.

When it is desired to change a code rate for error correction without changing the length of a message, a change in the design of the memory system may be needed. For example, when it is desired to use a second code rate less than a first code rate without changing the length of a message, a change in the size of a page or a chunk may be needed. The change in the size of a page or a chunk may result in a change in the design of many parts of a memory system. Since changing the design of many parts of the memory system is not practical, it is beneficial to find a scheme which can support the change of the code rate for error correction without causing many changes in the memory system.

Various embodiments of the disclosed technology provide methods, devices and systems that are capable of varying a code rate in error correction decoding while minimizing a change in the design of a memory system that was conventionally used.

Figure 2:
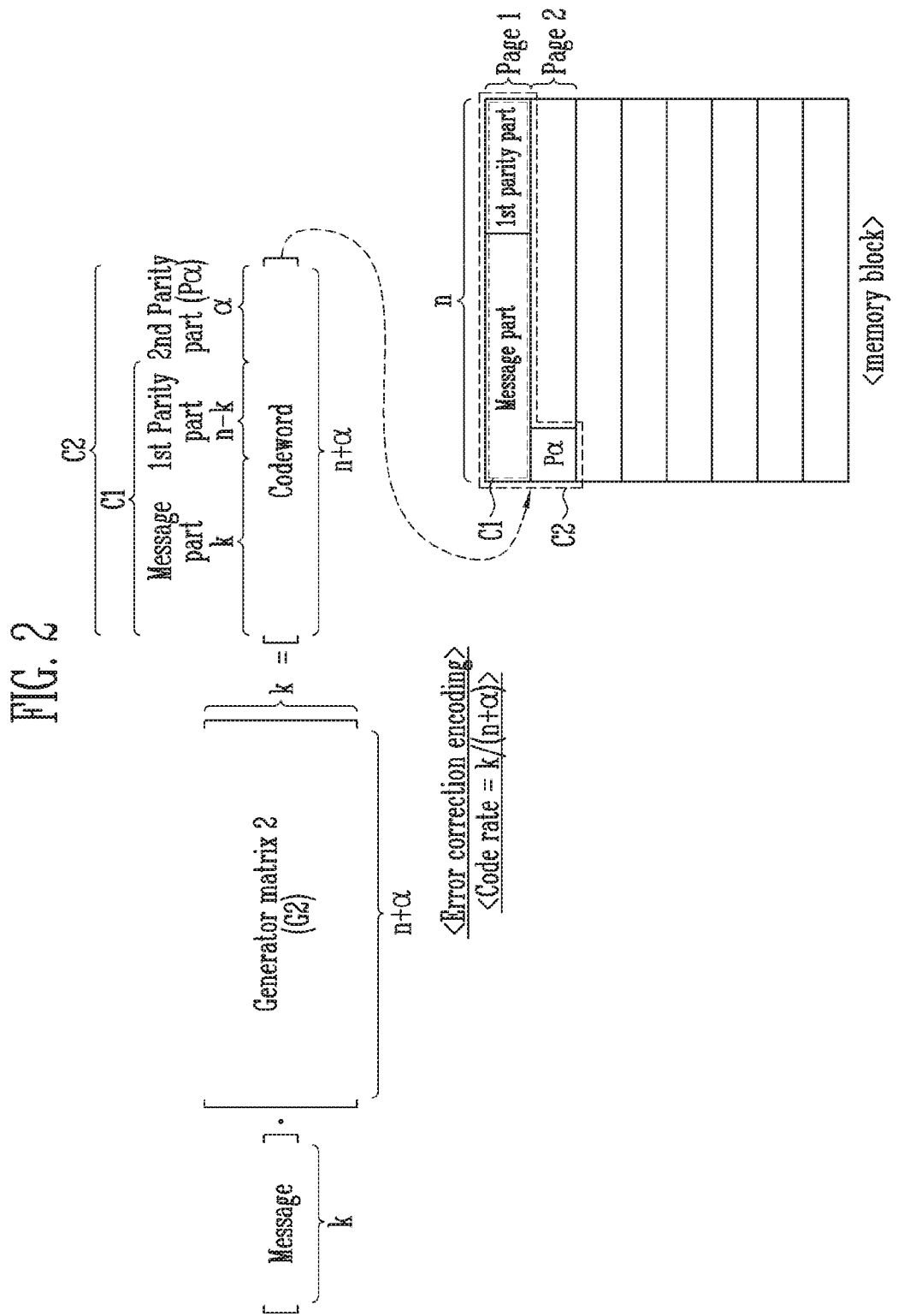
FIG. 2 shows a diagram illustrating an example in which a partial codeword and a second parity part included in a codeword are stored in a memory block when error correction encoding is performed using a second code rate less than a first code rate according to an embodiment of the disclosed technology.
Figure 3:
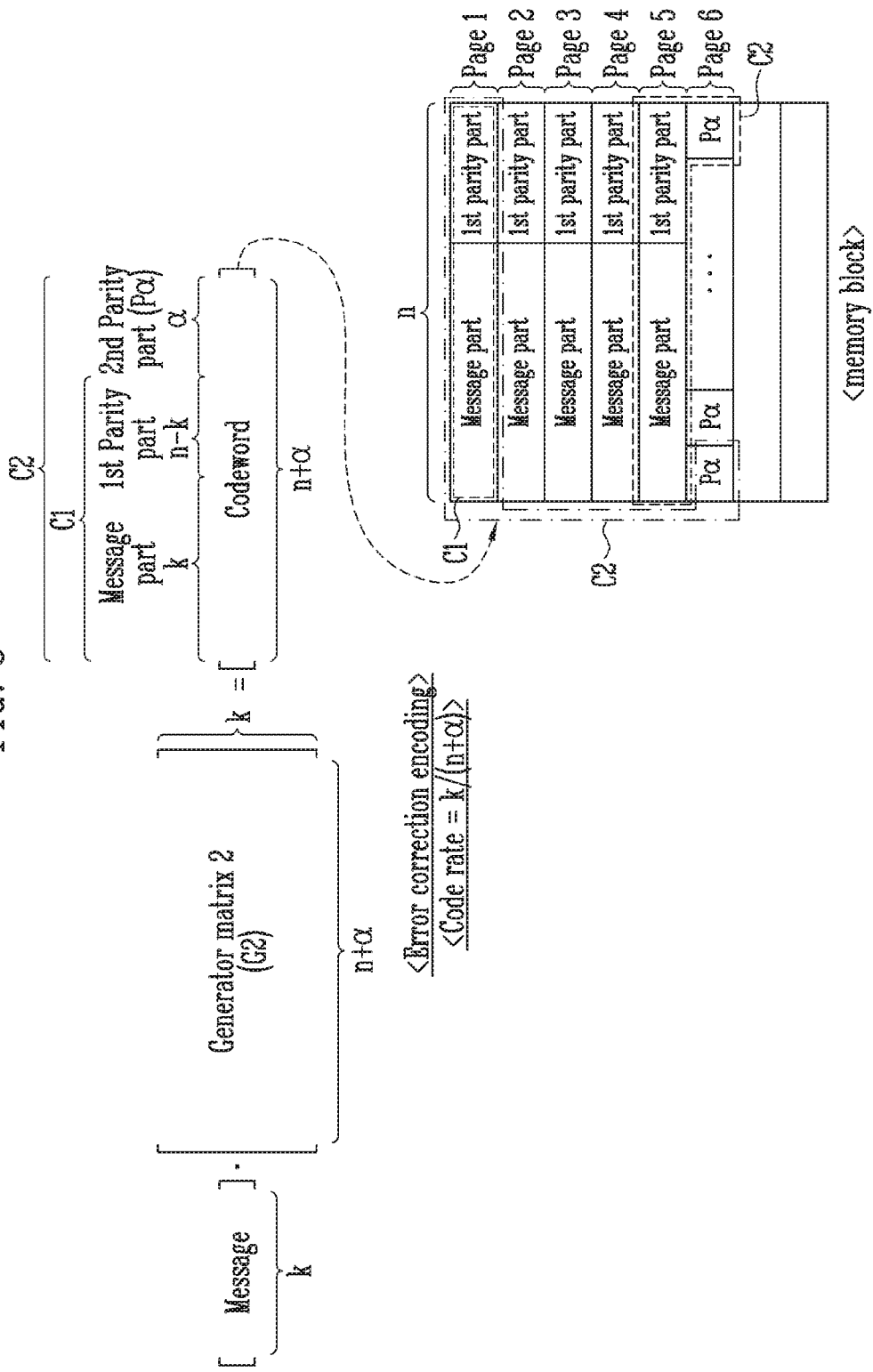
FIG. 3 shows a diagram illustrating an example in which partial codewords are stored in multiple pages of a memory block and second parity parts are stored in a page of the memory block when error correction encoding is performed using a second code rate less than a first code rate according to an embodiment of the disclosed technology.
Figure 4:
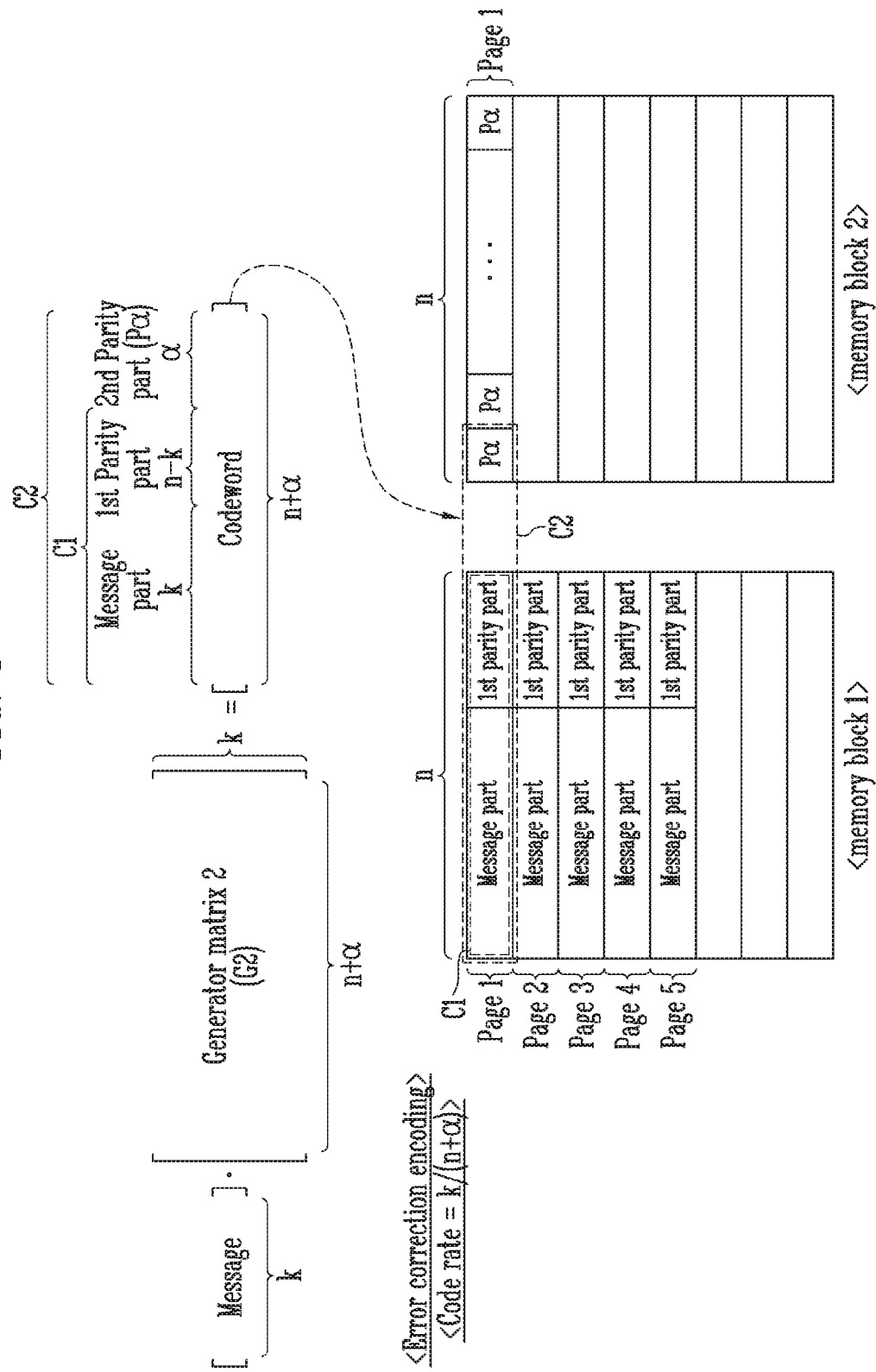
FIG. 4 shows a diagram illustrating an example in which partial codewords and second parity parts are stored in different memory blocks when error correction encoding is performed using a second code rate less than a first code rate according to an embodiment of the disclosed technology.

FIGS. 2 to 4 are diagrams illustrating examples in which a codeword is stored when error correction encoding is performed using a second code rate less than a first code rate according to an embodiment of the disclosed technology.

FIGS. 2 to 4 show examples of a case where error correction encoding is performed using a second generator matrix (generator matrix 2) G2. In the examples, the second generator matrix G2 is a generator matrix corresponding to a second code rate of k/(n+α). However, the embodiments of the disclosed technology are not limited thereto, and error correction encoding may be performed using a second parity check matrix (parity check matrix 2) H2, which is a parity check matrix corresponding to the second code rate of k/(n+α).

When error correction encoding is performed, a codeword having a bit length of n+α, i.e., an (n+α)-bit codeword, may be generated based on a k-bit message and a second generator matrix G2 having a k×(n+α) size. The n+α-bit codeword may include a k-bit message part and an (n−k+α)-bit parity part. Here, the (n−k+α)-bit parity part may include an n−k-bit first parity part ($1^{st}$ parity part) and an α-bit second parity part ($2^{nd}$ parity part) Pα. Here, α may be a natural number.

Hereinafter, an entire codeword including the k-bit message part, the n−k-bit first parity part, and the α-bit second parity part Pα is referred to as a 'codeword C2'. A part of the codeword C2, which includes the k-bit message part and the n−k-bit first parity part except the α-bit second parity part Pα, is referred to as a 'partial codeword C1'.

Assuming that a page included in a memory block has an n-bit length, the n+α-bit codeword C2 may be stored in a plurality of pages. In an embodiment, the partial codeword C1 and the second parity part Pα of a single codeword C2 may be stored in different pages. For example, as illustrated in FIG. 2, the partial codeword C1 may be stored in a first page (page 1) of the memory block, and the second parity part Pα may be stored in a second page (page 2) of the memory block.

Hereinafter, the codeword C2 will be described as being stored in a plurality of pages. However, such storing in pages are one implementation only and the embodiments of the disclosed technology are not limited thereto. For example, the codeword. C2 may also be stored in a plurality of chunks. In this case, a partial codeword C1 and a second parity part Pα of a single codeword C2 may be stored in different chunks included in the same page.

In an embodiment, when the codeword C2 is stored, a partial program scheme may be used. The partial program scheme allows to store data in parts of a single page. For example, the memory system may divide a page or a chunk into a plurality of write units (i.e., program units) depending on the preset number of partial programs (NOP). For example, when the length of the page or the chunk is n bits, the memory system may set the number of partial programs (NOP) to n/α. That is, the memory system may set the size of a program unit to α bits.

When the partial program scheme is used, the memory system may store a generated codeword C2 whenever a single codeword C2 is generated. Here, the partial codeword C1 of the codeword C2 may be stored in a single page or a single chunk, and the second parity part Pα of the codeword C2 may be stored in a single program unit.

In an embodiment, second parity parts Pα of corresponding codewords C2 may be stored in a single page or chunk. FIG. 3 illustrates an example in which partial codewords C1 are stored in a first (page 1) to a fifth page (page 5) of a memory block and second parity parts Pα corresponding to the partial codewords C1 are stored in a sixth page (page 6) of the memory block.

In an embodiment, the partial codewords C1 and the second parity parts Pα may be stored in different memory blocks. FIG. 4 illustrates an example in which partial codewords C1 are stored in a first page (page 1) to a fifth page (page 5) of a first memory block (memory block 1) and second parity parts Pα corresponding to the partial codewords C1 are stored in a first page (page 1) of a second memory block (memory block 2) is illustrated as an example.

In embodiments of the disclosed technology, the error correction circuit may perform error correction decoding using different code rates. Thus, the error correction circuit performs the error correction decoding while varying a code rate. For example, the code rate to be used for error correction decoding may vary depending on read values used for error correction decoding, e.g., whether error correction decoding is to be performed using read values corresponding to a partial codeword C1 or whether error correction decoding is to be performed using read values corresponding to a codeword C2.

Figure 5:
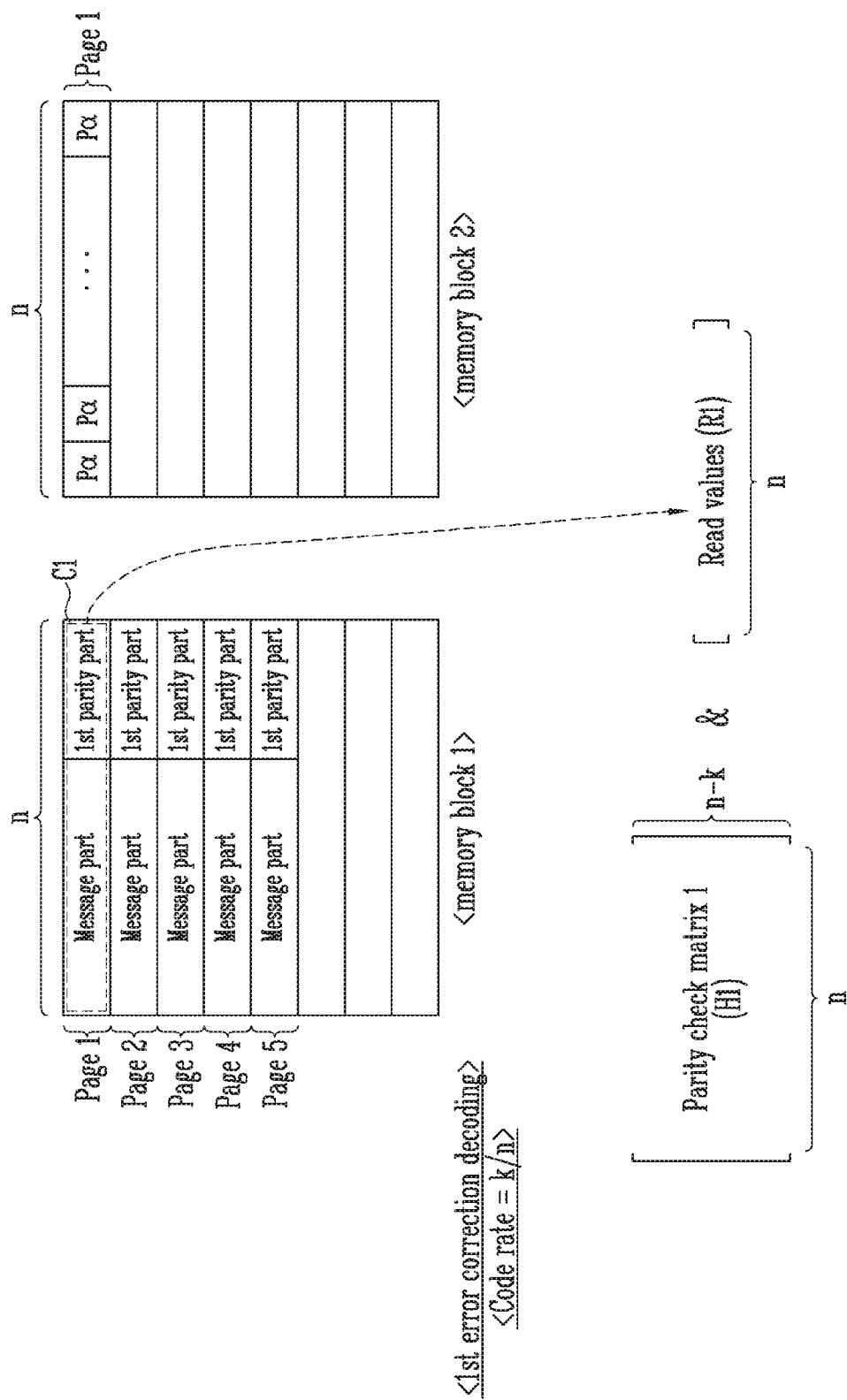
FIG. 5 shows a diagram illustrating an example of a first error correction decoding performed at a first code rate according to an embodiment of the disclosed technology.
Figure 6:
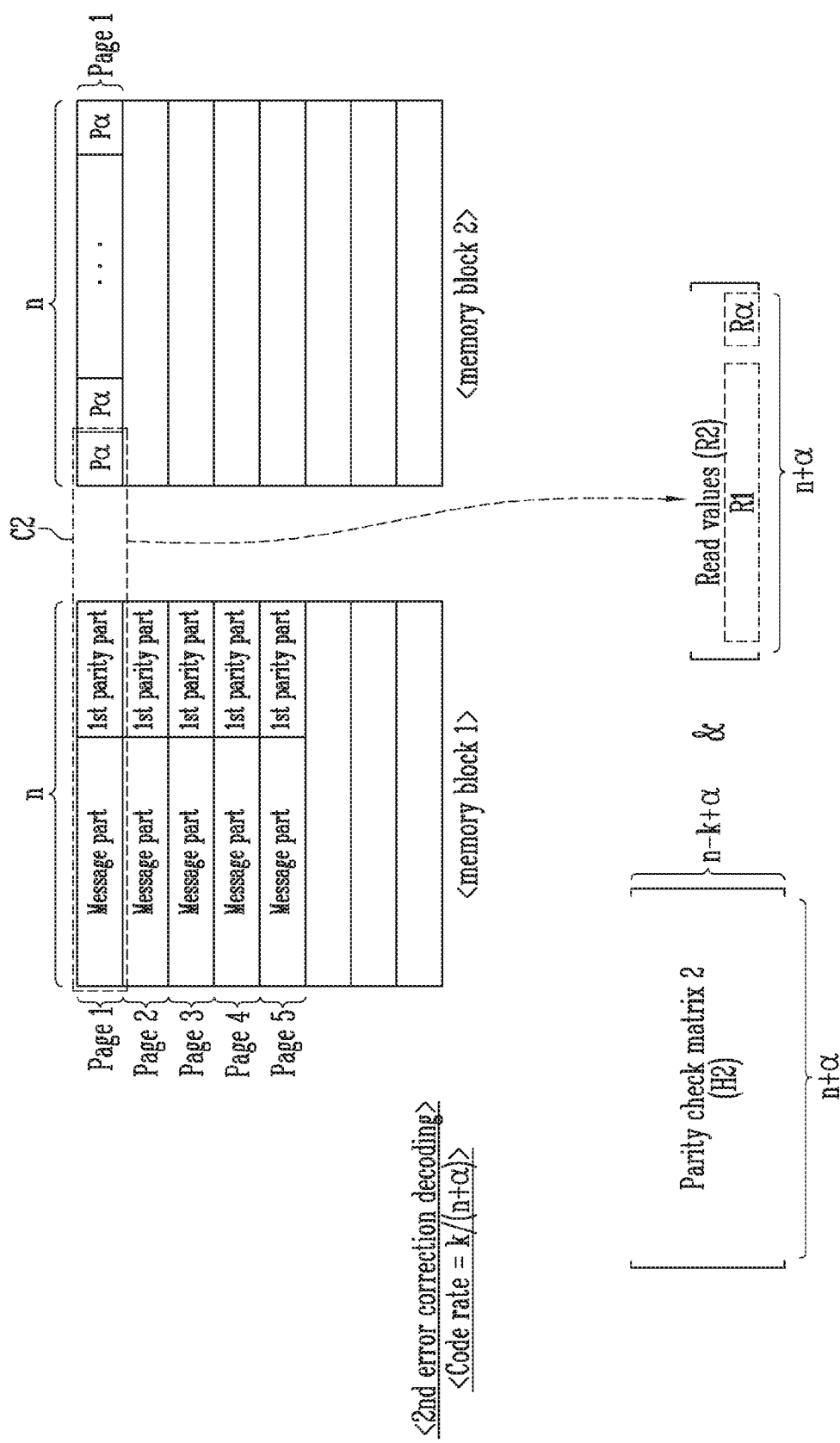
FIG. 6 shows a diagram illustrating an example of a second error correction decoding performed at second code rate according to an embodiment of the disclosed technology.

FIGS. 5 and 6 are diagrams illustrating examples of a case where a code rate varies in error correction decoding according to an embodiment of the disclosed technology.

In the embodiment to described with reference to FIGS. 5 and 6, it is assumed that a k-bit message is error correction-encoded at a second code rate of k/(n+α) and then an n+α-bit codeword C2 is generated. The n+α-bit codeword. C2 may include an n-bit partial codeword C1 and an α-bit second parity part ($2^{nd}$ parity part) Pα.

In FIGS. 5 and 6, as an example, an n-bit partial codeword C1 and an α-bit second parity part Pα are stored in different memory blocks (e.g., memory block 1 and memory block 2). However, embodiments of the disclosed technology are not limited thereto, and the disclosed technology may also be applied to a case where the partial codeword C1 and the second parity part Pα are stored in the same memory block.

The error correction circuit may perform first error correction decoding at a first code rate of k/n, and may perform second error correction decoding at a second code rate of k/(n+α). An example of a case where first error correction decoding is performed at a first code rate of k/n is illustrated in FIG. 5, and an example of a case where second error correction decoding is performed at a second code rate of k/(n+α) is illustrated in FIG. 6.

As illustrated in FIG. 5, the error correction circuit may perform first error correction decoding using a first parity check matrix H1 and read values R1. In this example, the first parity check matrix H1 used for the first error correction decoding corresponds to the first code rate of k/n and has a size of (n−k)×n, and the read values R1 have a size of n-bit corresponding to the partial codeword C1.

As illustrated in FIG. 6, the error correction circuit may perform second error correction decoding using a second parity check matrix H2 and read values R2. In this example, the second parity check matrix H2 used for the second error correction decoding corresponds to the second code rate of k/(n+α) and has a size of (n−k+α)×(n+α), and the read values R2 have a size of n+α-bit corresponding to the codeword C2. The n+α-bit read values R2 corresponding to the codeword C2 may include n-bit read values R1 corresponding to the partial codeword C1 and α-bit read values Ra corresponding to the second parity part Pa. In some implementations, the first parity check matrix H1 corresponding to the first code rate of k/n may have a special relationship with the second parity check matrix H2 corresponding to the second code rate of k/(n+α). This will be described in detail later with reference to FIG. 11 which is a related drawing.

The error correction circuit may perform error correction decoding by selectively applying at least one of the first code rate of k/n or the second code rate of k/(n+α). In an embodiment, the error correction circuit may perform first error correction decoding using the first code rate of k/n, and may perform second error correction decoding using the second code rate of k/(n+α) when the first error correction decoding fails.

Figure 7:
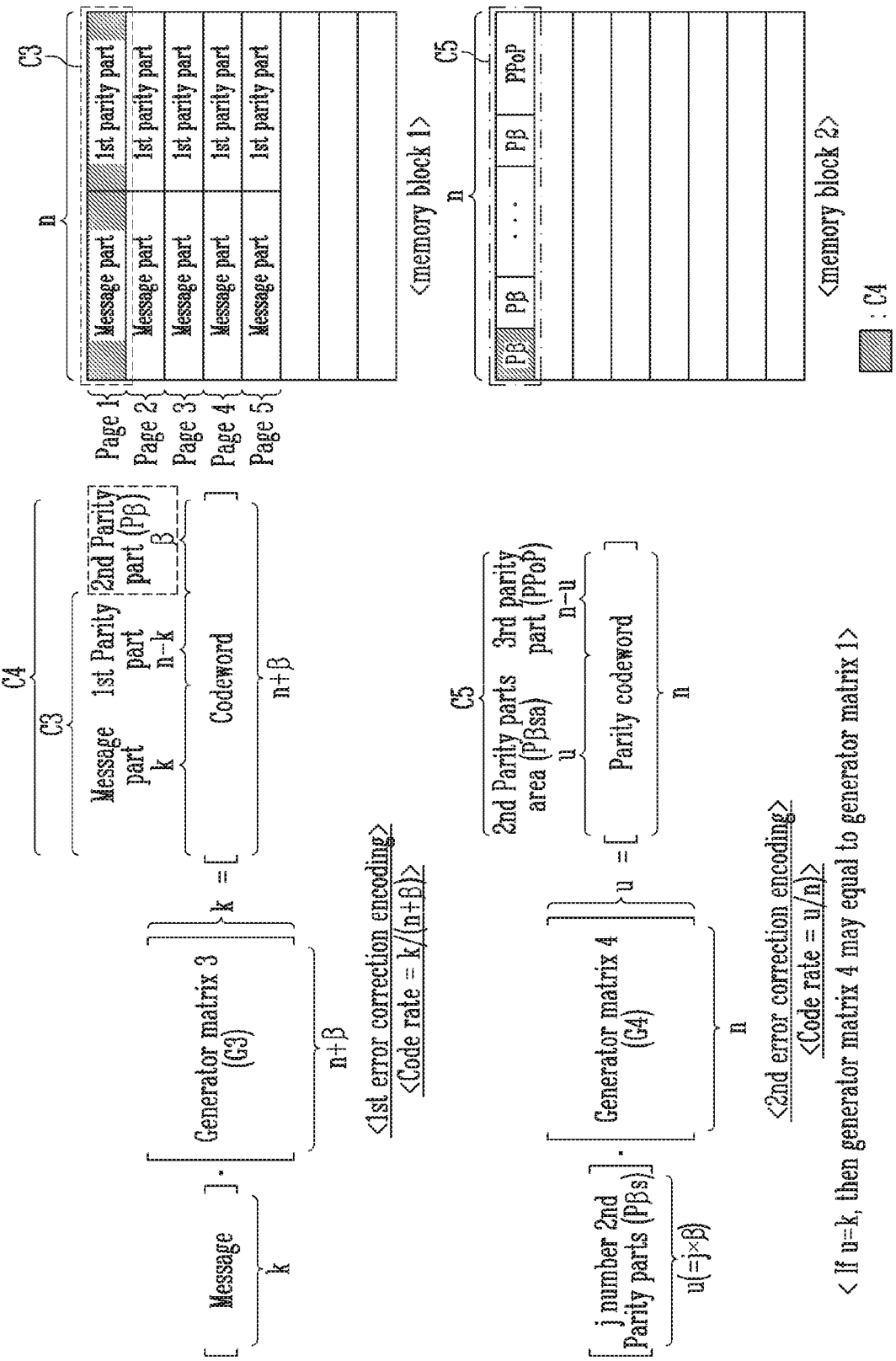
FIG. 7 is a diagram illustrating an example in which a codeword is stored when error correction encoding is performed using a third code rate less than a first code rate according to an embodiment of the disclosed technology.

FIG. 7 is a diagram illustrating an example in which a codeword is stored when error correction encoding is performed using a third code rate according to an embodiment of the disclosed technology. In FIG. 7, the third code rate may be less than the first code rate which is used for the decoding in the previous implementation. In the example of FIG. 7, there may an additional encoding which is performed for the parity part other than the message part.

In the example of FIG. 7, a third code rate may have a value of k/(n+β). Here, β may be a natural number less than or equal to $\alpha$. When $\alpha=\beta$, second code rate of k/(n+$\alpha$) and the third code rate of k/(n+$\beta$) may be equal to each other.

In the embodiment of FIG. 7, error correction encoding for a plurality of second parity parts P$\beta$s is additionally performed. Hereinafter, for convenience of description, error correction encoding that is performed on a message will be referred to as "first error correction encoding ($1^{st}$ error correction encoding)", and error correction encoding that is performed on a plurality of second parity parts P$\beta$s will be referred to as "second error correction encoding ($2^{nd}$ error correction encoding)".

In the example of FIG. 7, first error correction encoding is performed using a third generator matrix (generator matrix 3) G3 corresponding to the third code rate of k/(n+$\beta$). However, the embodiments of the disclosed technology are not limited thereto, and first error correction encoding may be performed using a third parity check matrix (parity check matrix 3) H3, which is a parity check matrix corresponding to the third code rate of k/(n+$\beta$).

In the example of FIG. 7, second error correction encoding is performed using a fourth generator matrix (i.e., generator matrix 4) G4. However, the embodiments of the disclosed technology are not limited thereto, and second error correction encoding may be performed using a fourth parity check matrix (parity check matrix 4) H4, which is a parity check matrix corresponding to the fourth generator matrix G4.

When first error correction encoding is performed, an n+$\beta$-bit codeword may be generated based on a k-bit message and a third generator matrix G3 having a size of k×(n+$\beta$). The n+$\beta$-bit codeword may include a k-bit message part and an (n−k+$\beta$)-bit parity part. Here, the (n−k+$\beta$)-bit parity part may include an n−k-bit first parity part ($1^{st}$ parity part) and a $\beta$-bit second parity part ($2^{nd}$ parity part) P$\beta$.

Hereinafter, a codeword including the k-bit message part, the n−k-bit first parity part, and the $\beta$-bit second parity part P$\beta$ is referred to as a "codeword C4". Also, the remaining part of the codeword C4 other than the $\beta$-bit second parity part P$\beta$ is referred to as a "partial codeword C3". Thus, the partial codeword C3 may include a k-bit message part and an n−k-bit first parity part.

When second error correction encoding is performed, a codeword having an n-bit length may be generated based on j second parity parts (j number of $2^{nd}$ parity parts) P$\beta$s corresponding to j partial codewords C3 (j number of partial codewords C3) and a fourth generator matrix G4 having a u×n size. Hereinafter, in order to be distinguished from a first error correction-encoded codeword C4, a second error correction-encoded codeword will be referred to as a "parity codeword C5". The parity codeword C5 may include a u-bit second parity part area P$\beta$sa and an n−u-bit third parity part PPoP. Here, u=j×$\beta$, and j and u may be natural numbers. If u=k, the fourth generator matrix G4 may be equal to the first generator matrix G1.

Assuming that a page included in a memory block has an n-bit length, an n-bit partial codeword C3 may be stored in a single page. Further, the parity codeword C5 may be stored in a page different from the page in which the partial codeword C3 is stored.

FIG. 7 illustrates an example in which partial codewords C3 are stored in a first page (page 1) to a fifth page (page 5) of a first memory block (memory block 1) and in which a parity codeword C5 corresponding to a plurality of partial codewords C3 is stored in a first page (page 1) of a second memory block (memory block 2).

However, the disclosed technology is not limited thereto, and the partial codewords C3 and the parity codeword C5 corresponding to the partial codewords C3 may be stored in the same memory block.

In embodiments of the disclosed technology, the error correction circuit may perform error correction decoding while varying a code rate. For example, the code rate to be used for error correction decoding may vary depending on whether error correction decoding is to be performed using read values corresponding to a partial codeword C3 or whether error correction decoding is to be performed using read values corresponding to codeword C4.

Figure 8:
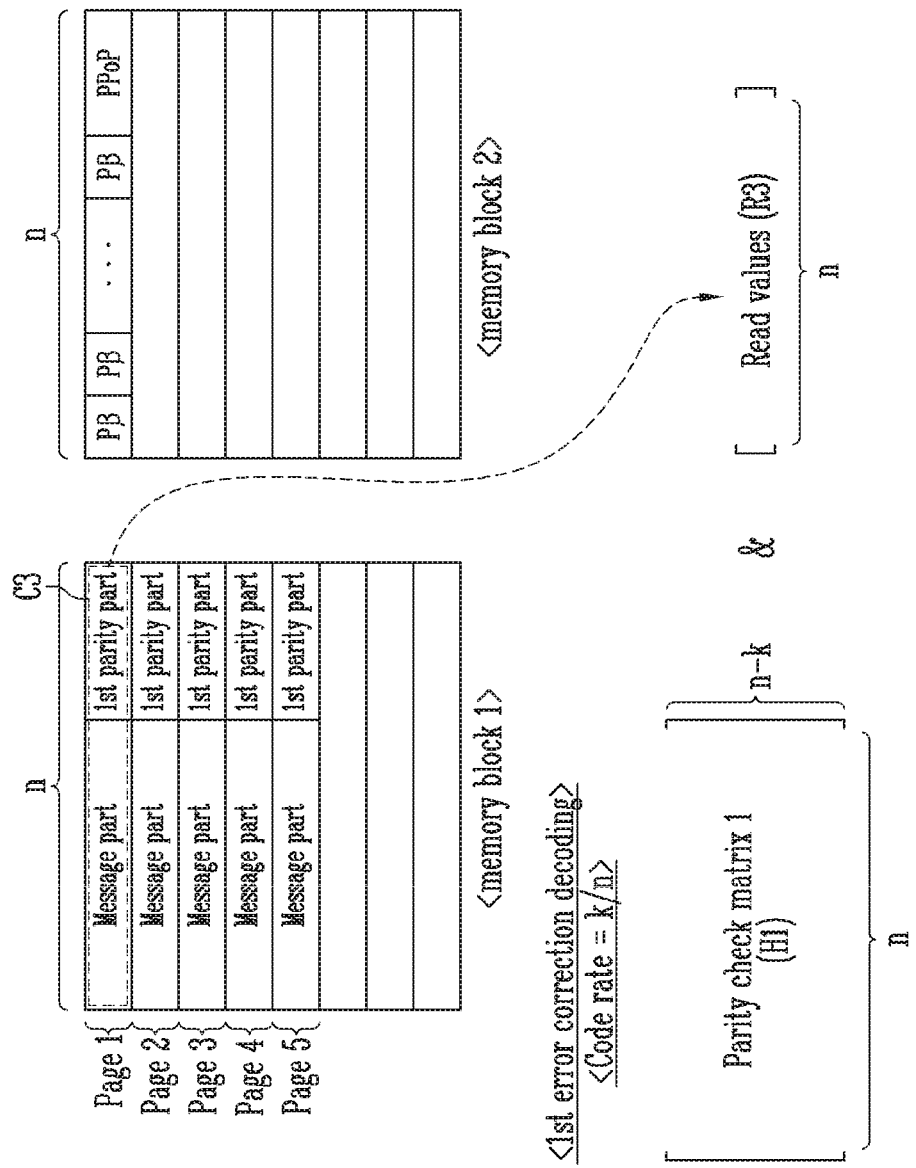
FIG. 8 shows a diagram illustrating an example of a first error decoding performed at a first rate according to an embodiment of the disclosed technology.
Figure 9:
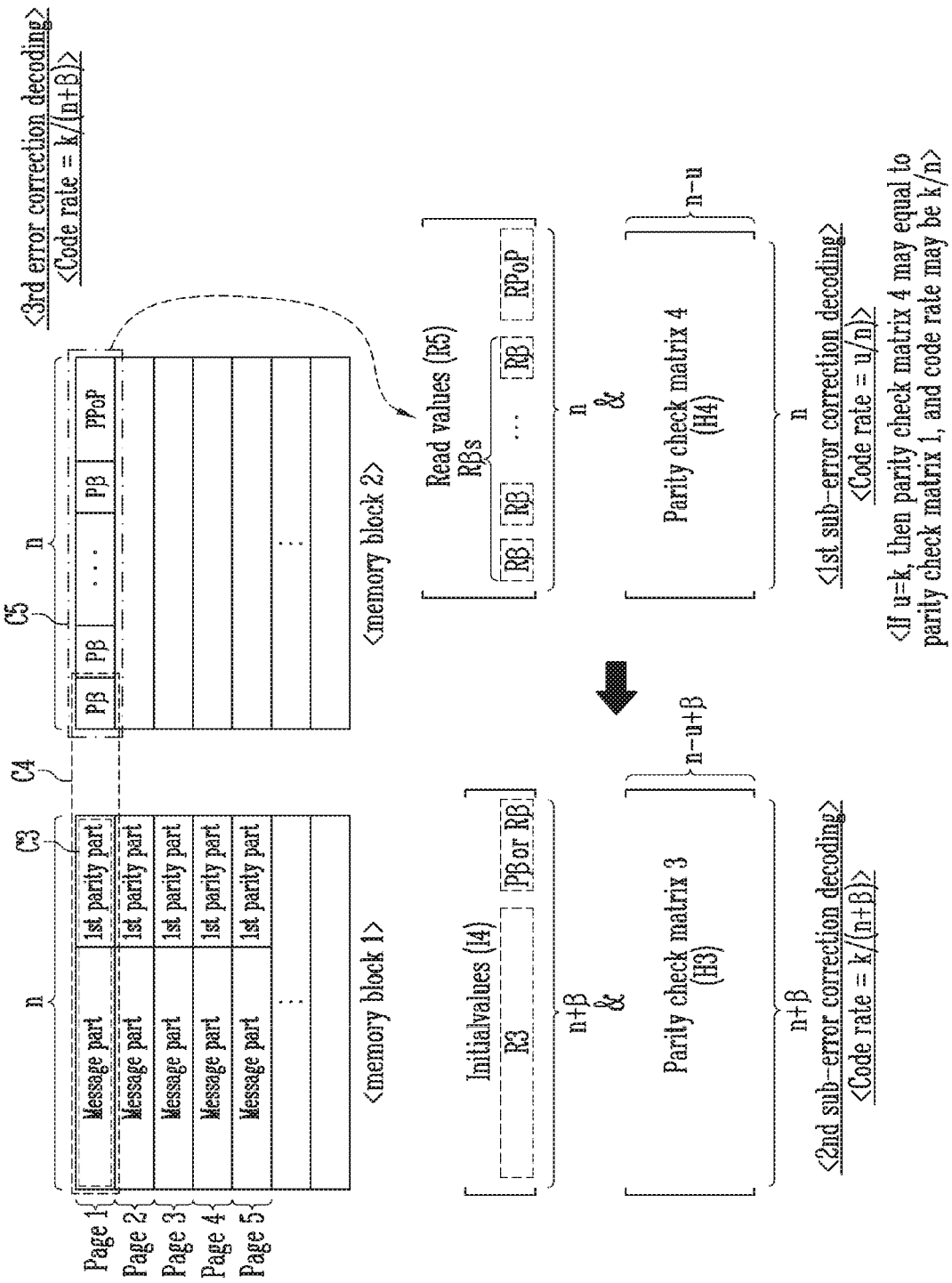
FIG. 9 shows a diagram illustrating an example of a third error correction decoding performed at a third rate according to an embodiment of the disclosed technology.

FIGS. 8 and 9 are diagrams illustrating examples of error correction decoding using different code rates corresponding to first code rate and the third code rate, respectively, according to an embodiment of the disclosed technology.

As discussed with reference to FIG. 7, k-bit messages undergo first error correction encoding at a third code rate of k/(n+$\beta$), and then n+$\beta$-bit codewords C4 are generated. Each of the n+$\beta$-bit codewords C4 may include an n-bit partial codeword C3 and a $\beta$-bit second parity part P$\beta$.

In addition, j second parity parts P$\beta$s corresponding to j partial codewords C3 undergo second error correction encoding, and then an n-bit parity codeword C5 is generated. The n-bit parity codeword C5 may include a u-bit second parity part area P$\beta$sa and an n−u-bit third parity part ($3^{rd}$ parity part) PPoP.

Further, in the embodiment to be described with reference to FIGS. 8 and 9, it is assumed that n-bit partial codewords C3 and an n-bit parity codeword C5 are stored in different memory blocks (e.g., memory block 1 and memory block 2). However, embodiments of the disclosed technology are not limited thereto, and the disclosed technology may also be applied to a case where the partial codewords C3 and the parity codeword C5 are stored in the same memory block.

The error correction circuit may perform first error correction decoding at a first code rate of k/n, and may perform third error correction decoding at a third code rate of k/(n+$\beta$). An example of a case where first error correction decoding is performed at a first code rate of k/n is illustrated in FIG. 8, and an example of a case where third error correction decoding is performed at a third code rate of k/(n+$\beta$) is illustrated in FIG. 9.

Since the parity codeword C5 is associated with a plurality of second parity parts included in a plurality of codewords C4, respectively, there are multiple codewords C4 corresponding to a single parity codeword C5. Among the multiple codewords C4, a codeword C4 that is the target of first error correction decoding or third error correction decoding is referred to as a "target codeword C4".

As illustrated in FIG. 8, the error correction circuit may perform first error correction decoding using a first parity check matrix H1 corresponding to the first code rate of k/n and having a size of (n−k)×n, and n-bit read values R3 corresponding to the partial codeword C3 of the target codeword C4. Here, the first parity check matrix H1 corresponding to the first code rate of k/n may have a special relationship with a third parity check matrix H3 corresponding to the third code rate of k/(n+$\beta$). This will be described in detail later with reference to FIG. 11 which is a related drawing.

As illustrated in FIG. 9, third error correction decoding performed at the third code rate may include first sub-error correction decoding and second sub-error correction decoding.

When first sub-error correction decoding is performed, the error correction circuit may perform first sub-error correction decoding using a fourth parity check matrix H4 having a size of (n−u)×n and n-bit read values R5 corresponding to the parity codeword C5. The n-bit read values R5 corresponding to the parity codeword C5 may include a plurality of read values Rβs corresponding to a plurality of second parity parts Pβ and read values RPoP corresponding to the third parity part PPoP. In the implementation that u=k, the fourth parity check matrix H4 may be equal to the first parity check matrix H1.

When the first sub-error correction decoding succeeds (passes), the second parity part Pβ corresponding to the partial codeword C3 of the target codeword C4 included in the decoded parity codeword C5 may be used for second sub-error correction decoding.

When first sub-error correction decoding fails, the read values Rβ corresponding to the partial codeword C3 of the target codeword C4, among the read values R5, may be used for second sub-error correction decoding.

When second sub-error correction decoding is performed, the error correction circuit may use either the second parity part Pβ corresponding to the partial codeword C3 of the target codeword C4 or read values R corresponding to the partial codeword C3 of the target codeword C4. For example, the error correction circuit may determine initial values I4 to be assigned to variable nodes using the read values R3 corresponding to the partial codeword C3 and the second parity part Pβ, or may determine initial values I4 to be assigned to the variable nodes using the read values R3 corresponding to the partial codeword C3 and read values Rβ corresponding to the second parity part Pβ.

When second sub-error correction decoding is performed, the error correction circuit may perform second sub-error correction decoding using a parity check matrix corresponding to a third code rate of k/(n+β), that is, a third parity check matrix H3 having a size of (n−u+β)×(n+β), and the initial values I4.

The error correction circuit may perform error correction decoding by selectively applying at least one of the first code rate of k/n or the third code rate of k/(n+β). In an embodiment, the error correction circuit may perform first error correction decoding using the first code rate of k/n, and may perform third error correction decoding using the third code rate of k/(n+β) when the first error correction decoding fails.

Figure 10:
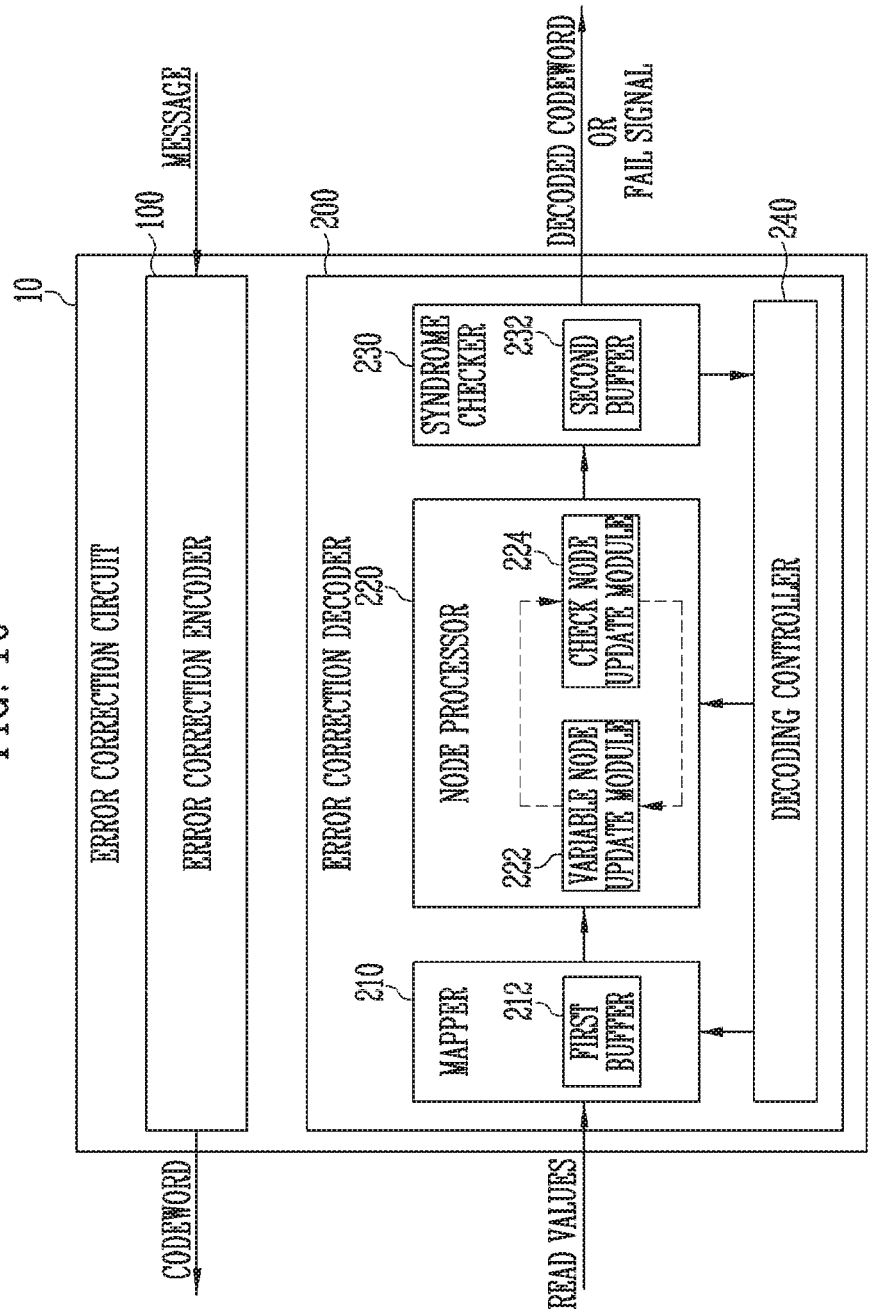
FIG. 10 is a diagram illustrating an error correction circuit according to an embodiment of the disclosed technology.

FIG. 10 is a diagram illustrating an error correction circuit according to an embodiment of the disclosed technology.

Referring to FIG. 10, an error correction circuit 10 may include an error correction encoder 100 and an error correction decoder 200.

The error correction encoder 100 may receive a message that is the target of error correction encoding, and may perform error correction encoding using the received message and a generator matrix of an error correction code (ECC). In an embodiment, the error correction encoder 100 may also perform error correction encoding using a parity check matrix of the error correction code.

The error correction encoder 100 may perform error correction encoding. As the result of the error correction encoding, the error correction encoder 100 may generate a codeword and output the codeword to a channel. The channel may refer to, for example, a wired or wireless medium through which information is transferred or a storage medium in which information is stored. For example, when the error correction circuit 10 is applied to a memory system, the channel may refer to either an interface which transmits and receives data between the error correction circuit 10 and a memory device, or the memory device itself. Codewords may be stored in a plurality of memory cells (e.g., memory cells constituting a single page) included in the memory device. The error correction encoder 100 may be a low-density parity check (LDPC) encoder that uses an LDPC code as the error correction code (ECC).

In an embodiment, the error correction encoder 100 may perform error correction encoding using a second code rate of k/(n+α) as discussed with the implementation of FIG. 2. For example, the error correction encoder 100 may generate an n+α-bit codeword C2 by performing error correction encoding using a k-bit message and a second generator matrix G2 or a second parity check matrix H2 corresponding to the second code rate of k/(n+α). The codeword C2 may include an n-bit partial codeword C1 and an α-bit second parity part Pα.

In accordance with an embodiment, the error correction encoder 100 may perform error correction encoding using a third code rate of k/(n+β) as discussed with the implementation of FIG. 7. Error correction encoding using the third code rate of k/(n+β) may include first error correction encoding and second error correction encoding. For example, the error correction encoder 100 may generate an n+β-bit codeword C4 by performing first error correction encoding using a k-bit message and a third generator matrix G3 or a third parity check matrix H3 corresponding to the third code rate of k/(n+β). The codeword C4 may include an n-bit partial codeword C3 and a β-bit second parity part Pβ. The error correction encoder 100 may generate an n-bit parity codeword C5 by performing second error correction encoding using j second parity parts Pβs corresponding to j partial codewords C3 and a fourth generator matrix G4 or a fourth parity check matrix H4. The parity codeword C5 may include a u-bit second parity part area Pβsa and an n−u-bit third parity part PPoP.

The error correction decoder 200 may perform error correction decoding using various algorithms which adopt an iterative decoding scheme. For example, the error correction decoder 200 may perform error correction decoding using a message passing algorithm (MPA) that is also referred to as a "belief propagation algorithm (BPA)".

The error correction decoder 200 may perform error correction decoding based on the iterative decoding scheme within the preset maximum number of iterations (i.e., the maximum iteration number). When a valid codeword that satisfies constraints for a parity check matrix of an error correction code (ECC) is generated within the maximum iteration number, the error correction decoder 200 may output the corresponding valid codeword as a decoded codeword. When a valid codeword that satisfies the constraints for the parity check matrix of an error correction code is not generated within the maximum iteration number, the error correction decoder 200 may output a fail signal indicating that error correction decoding has failed. The error correction decoder 200 may use a low-density parity check (LDPC) code as the error correction code (ECC).

In an embodiment, the error correction decoder 200 may perform error correction decoding while varying a code rate.

When error correction encoding is performed at a second code rate of k/(n+α), the error correction decoder 200 may perform first error correction decoding using a first code rate of k/n, or may perform second error correction decoding using the second code rate of k/(n+α), When first error correction decoding is performed using the first code rate of k/n, the error correction decoder 200 may use a first parity check matrix H1 having a size of (n−k)×n and n-bit read values R1 corresponding to the partial codeword C1.

When second error correction decoding is performed using the second code rate of k/(n+α), the error correction decoder 200 may use a second parity check matrix H2 having a size of (n−k+α)×(n+α) and n+α-bit read values R2 corresponding to the codeword C2.

In an embodiment, the error correction decoder 200 may perform second error correction decoding using the second code rate of k/(n+α) when first error correction decoding using the first code rate of k/n fails. In an embodiment, the error correction decoder 200 may receive read values Rα corresponding to the second parity part Pα when first error correction decoding using the first code rate of k/n fails.

When error correction encoding is performed at a third code rate of k/(n+β), the error correction decoder 200 may perform first error correction decoding using the first code rate of k/n, or may perform third error correction decoding using the third code rate of k/(n+β). When first error correction decoding is performed using the first code rate of k/n, the error correction decoder 200 may use a first parity check matrix H1 having a size of (n−k)×n and n-bit read values R3 corresponding to the partial codeword C3 of the target codeword C4.

Third error correction decoding using the third code rate of k/(n+β) may include first sub-error correction decoding and second sub-error correction decoding. When first sub-error correction decoding is performed, the error correction decoder 200 may use a fourth parity check matrix H4 having a size of (n−u)×n and read values R5 corresponding to a parity codeword C5. If u=k, the fourth parity check matrix H4 may be equal to the first parity check matrix H1.

When second sub-error correction decoding is performed, the error correction decoder 200 may use initial values I4 configured differently depending on whether first sub-error correction decoding has succeeded (passed). The initial values I4 may be determined to correspond to the third parity check matrix H3 having a size of (n−u+β)×(n+β).

For example, when first sub-error correction decoding fails, the error correction decoder 200 may determine initial values I4 based on read values R3 corresponding to the partial codeword C3 of the target codeword C4 and read values Rβ corresponding to the second parity part Pβ of the target codeword C4, and may perform second sub-error correction decoding using the determined initial values I4.

For example, when first sub-error correction decoding is successful, i.e., it passes, the error correction decoder 200 may determine initial values I4 based on the read values R3 corresponding to the partial codeword C3 of the target codeword C4 and the second parity part Pβ of the target codeword C4, and may perform second sub-error correction decoding using the determined initial values I4.

In an embodiment, the error correction decoder 200 may perform third error correction decoding using the third code rate of k/(n+β) when first error correction decoding using the first code rate of k/n fails. In an embodiment, the error correction decoder 200 may receive read values R5 corresponding to the parity codeword C5 when first error correction decoding using the first code rate of k/n fails.

The error correction decoder 200 may include a mapper 210, a node processor 220, a syndrome checker 230, and a decoding controller 240. In an embodiment, at least one of the mapper 210, the syndrome checker 230, or the decoding controller 240 may be present outside the error correction decoder 200.

The mapper 210 may receive read values from a channel. Each of the read values may be '0' or '1'. When hard-decision decoding is used, a single set of read values may correspond to a single codeword. The single set of read values may be referred to as a 'single read vector'. When soft-decision decoding is used, a plurality of sets of read clues correspond to a single codeword. That is, when soft-decision decoding is used, a plurality of read vectors may correspond to a single codeword.

The mapper 210 may generate quantized read values using the read values. For example, the mapper 210 may generate a read vector quantized into g+1 levels using g read vectors. Each of read values included in the read vector quantized into g+1 levels may be a read value quantized into g+1 levels. Each of the read values quantized into g+1 levels may be a read pattern (e.g., a bit sequence) composed of g bits. For example, each of the read values quantized into two levels may be '1' or '0'. For example, one of the read values quantized into two levels may be '1', and the remaining one thereof may be '0'. For example, each of the read values quantized into three levels may be '11', '10', '01' or '00'. For example, one of the read values quantized into three levels may be '11', another may be '00', and the other may be '10' or '01'.

When soft-decision decoding is used (i.e., when g is equal to or greater than 2), the mapper 210 may generate a read vector quantized into g+1 levels by combining g read vectors corresponding to g read voltages. For example, when two read voltages (e.g., a first read voltage and a second read voltage) are used, the mapper 210 may generate a read vector quantized into three levels by combining a read vector corresponding to the first read voltage with a read vector corresponding to the second read voltage. For this operation, the mapper 210 may include a first buffer 212. When the g read voltages are used, the first buffer 212 may receive and store read vectors respectively corresponding to the g read voltages. Therefore, the mapper 210 may generate the read vector quantized into g+1 levels by combining the g read vectors stored in the first buffer 212 in accordance with the g read voltages.

When hard-decision decoding is used (i.e., when g is 1), the mapper 210 may determine that a single read vector itself is a read vector quantized into two levels.

The mapper 210 may convert the read vector, quantized into g+1 levels, into an initial vector used for error correction decoding that conforms to an iterative decoding scheme, and may provide the initial vector to the node processor 220. The initial vector may include a plurality of initial values. The mapper 210 may convert read values, quantized into g+1 levels, into respective initial values. The initial values may be or include, for example, log likelihood ratio (LLR) values.

Hereinafter, in the description of embodiments of the disclosed technology, the read values may mean read values quantized into g+1 levels. For example, n-bit read values R1, n-bit read values R3, n-bit read values R5, α-bit read values Rα or β-bit read values Rβ, which have been discussed with reference to FIGS. 5, 6, 8 and 9, may mean read values quantized into g+1 levels.

In an embodiment, when first error correction decoding is performed at a first code rate of k/n, the mapper 210 may receive n-bit read values R1 or R3 corresponding to a partial codeword C1 or C3. The mapper 210 may determine initial values to be assigned to variable nodes corresponding to the first parity check matrix H1 using the n-bit read values R1 or R3, and may provide the determined initial values to the node processor 220.

In an embodiment, when second error correction decoding is performed at a second code rate of k/(n+α), the mapper 210 may further receive α-bit read values Rα corresponding to a second parity part Pα. The mapper 210 may determine initial values to be assigned to variable nodes corresponding to a second parity check matrix H2 using the n-bit read values R1 and the α-bit read values Rα, and may provide the determined initial values to the node processor 220.

In an embodiment, when third error correction decoding is performed at a third code rate of k/(n+β), the mapper 210 may further receive n-bit read values R5 corresponding to a parity codeword C5. The n-bit read values R5 may include a plurality of β-bit read values Rβ corresponding to a plurality of codewords C4.

When first sub-error correction decoding using n-bit read values corresponding to the parity codeword C5 fails, the mapper 210 may determine initial values to be assigned to variable nodes corresponding to a third parity check matrix H3 using n-bit read values R3 corresponding to the partial codeword C3 of a target codeword C4 and β-bit read values Rβ corresponding to the second parity part Pβ of the target codeword C4, and may provide the determined initial values to the node processor 220.

When first sub-error correction decoding using n-bit read values R5 corresponding to the parity codeword C5 passes (or succeeds), the mapper 210 may determine initial values to be assigned to variable nodes corresponding to the third parity check matrix H3 using n-bit read values R3 corresponding to the partial codeword C3 of the target codeword C4 and the second parity part PP of the target codeword C4, and may provide the determined initial values to the node processor 220.

In accordance with an embodiment, the mapper 210 may set the initial values corresponding to the second parity part Pβ so that the initial values have the same magnitude. In an embodiment, the mapper 210 may determine the initial values so that, among the initial values corresponding to entire of the target codeword C4, initial values corresponding to the second parity part Pβ have the largest magnitude.

The node processor 220 may perform error correction decoding based on the initial vector (i.e. initial values) received from the mapper 210 within the maximum iteration number. The node processor 220 may perform error correction decoding using various algorithms which adopt an iterative decoding scheme. For example, the node processor 220 may perform error correction decoding using a message passing algorithm (MPA). As the message passing algorithm, a sum-product algorithm, a minimum (min)-sum algorithm or the like may be used. In various implementations, various algorithms may be used.

The message passing algorithm enables the generation of a result which converges on a codeword via exchange of messages performed between variable nodes and check nodes. The messages may include Variable to Check (V2C) messages that are sent from the variable nodes to the check nodes and. Check to Variable (C2V) messages that are sent from the check nodes to the variable nodes. A process including a procedure for sending V2C messages that are sent from variable nodes to check nodes, a procedure for sending C2V messages that are sent from the check nodes to the variable nodes, and a procedure for updating the values of respective nodes depending on the sending procedures may be referred to as a "single iteration".

The node processor 220 may include a variable node update module 222 and a check node update module 224.

The variable node update module 222 may initialize variable nodes using an initial vector, for example, LLR values, received from the mapper 210 before a first iteration is performed. The variable node update module 222 may assign the initial values included in the initial vector to respective variable nodes one by one.

The variable node update module 222 may generate V2C messages and send the V2C messages to the check node update module 224 in a first iteration so that initial values of respective variable nodes are transferred to check nodes coupled to the corresponding variable nodes.

The variable node update module 222 may update the values of the variable nodes in response to the C2V messages received from the check node update module 224 in respective iterations. The variable node update module 222 may generate V2C messages based on the C2V messages, received from the check node update module 224, and send the generated V2C messages to the check node update module 224 in respective iterations except the first iteration.

The check node update module 224 may update the values of the check nodes in response to the V2C messages received from the variable node update module 222 in respective iterations. The check node update module 224 may generate C2V messages based on the V2C messages, received from the variable node update module 222, and send the generated C2V messages to the variable node update module 222 in respective iterations.

The initial values and the messages may be referred to as "soft information". The soft information may include values represented by integers or real numbers. The soft information may be, for example, a log likelihood ratio (LLR) value. The soft information may include an estimation value indicating whether each of the symbols belonging to a codeword is '0' or '1' and a confidence value for the corresponding estimation value. For example, the soft information may include a sign bit and a magnitude bit. The sign bit may indicate an estimation value for the corresponding symbol. For example, a sign bit indicating a negative value may represent that the likelihood of the corresponding symbol being "1" is higher than that of a sign bit indicating a positive value. In contrast, the sign bit indicating a positive value may represent that the likelihood of the corresponding symbol being "0" is higher than that of the sign bit indicating a negative value. The magnitude bit may indicate the confidence value of the corresponding sign bit. For example, as the magnitude bit indicates a larger value, it may be considered that the confidence value of the sign bit is higher.

The node processor 220 may perform iterations within the maximum iteration number and may provide, to the syndrome checker 230, the values of variable nodes (hereinafter referred to as a "variable node vector $C_i$") obtained as a result of performing an i-th iteration. Here, I is a natural number and i is a natural number less than or equal to I. The variable node vector may be a row vector or a column vector. Below, in the description of the embodiments of the disclosed technology, the variable node vector is assumed to be a row vector.

In an embodiment, the node processor 220 may perform error correction decoding based on a parity check matrix corresponding to a code rate.

In an embodiment, when first error correction decoding is performed at a first code rate of k/n, the node processor 220 may perform first error correction decoding using a parity check matrix corresponding to the first code rate of k/n and initial values received from the mapper 210. For example, when initial values corresponding to the read values R1 are received from the mapper 210, the node processor 220 may assign the received initial values to the variable nodes corresponding to a first parity check matrix H1 one by one. For example, when initial values corresponding to the read values R3 are received from the mapper 210, the node processor 220 may assign the received initial values to the variable nodes corresponding to the first parity check matrix H1 one by one.

In an embodiment, when second error correction decoding is performed at a second code rate of k/(n+α), the node processor 220 may perform second error correction decoding using a second parity check matrix H2 corresponding to the second code rate of k/(n+α) and initial values received from the mapper 210. For example, when initial values corresponding to the read values R2 are received from the mapper 210, the node processor 220 may assign the received initial values to the variable nodes corresponding to the second parity check matrix H2 one by one.

In an embodiment, when third error correction decoding is performed at a third code rate of k/(n+β), the node processor 220 may perform at least one of first sub-error correction decoding or second sub-error correction decoding.

In an embodiment, when first sub-error correction decoding is performed, the node processor 220 may perform first sub-error correction decoding using a fourth parity check matrix H4 and initial values received from the mapper 210. For example, when initial values corresponding to read values R5 are received from the mapper 210, the node processor 220 may assign the received initial values to the variable nodes corresponding to the fourth parity check matrix H4 one by one.

In an embodiment, when second sub-error correction decoding is performed, the node processor 220 may perform second sub-error correction decoding using a third parity check matrix H3 corresponding to the third code rate of k/(n+β) and the initial values received from the mapper 210. For example, when initial values I4 corresponding to the target codeword C4 are received from the mapper 210, the node processor 220 may assign the received initial values I4 to the variable nodes corresponding to the third parity check matrix H3 one by one.

In an embodiment, when second sub-error correction decoding is performed, the variable node update module 222 may determine V2C messages that are to be sent from variable nodes corresponding to the second parity part Pβ in all iterations, regardless of C2V messages that are input to the variable nodes corresponding to the second parity part Pβ. For example, the variable node update module 222 may determine V2C messages that are to be sent from variable nodes corresponding to the second parity part Pβ based on only the initial values corresponding to the variable nodes corresponding to the second parity part Pβ, in all iterations. This may mean that, in all iterations, the V2C messages sent from the variable nodes corresponding to the second parity part Pβ are fixed without being changed.

In an embodiment, when second sub-error correction decoding is performed, the variable node update module 222 may not update the values of the variable nodes corresponding to the second parity part Pβ in all iterations, regardless of C2V messages that are input to the variable nodes corresponding to the second parity part Pβ.

When a valid codeword that satisfies constraints (or conditions) for a parity check matrix of an error correction code is generated within the maximum iteration number I, the syndrome checker 230 may output the corresponding valid codeword as a decoded codeword. For example, the syndrome checker 230 may store, in a second buffer 232, a variable node vector $C_i$ received from the node processor 220 in an i-th iteration, and may perform a syndrome check on the received variable node vector $C_i$. For example, the syndrome check may be performed by checking whether all symbols of a syndrome vector $S_i$ calculated by the following Equation (1) are '0'.

$$S_i = H \cdot C_i^T \qquad (1)$$

Here, $S_i$ denotes a syndrome vector corresponding to the i-th iteration, H denotes the parity check matrix of the error correction code, and $C_i^T$ denotes a transposed matrix of the variable node vector $C_i$ corresponding to the i-th iteration.

When all symbols of the syndrome vector $S_i$ are '0', it is determined that the syndrome check has been passed. This means that error correction decoding has been successfully performed in the i-th iteration, and thus the syndrome checker 230 may output the variable node vector $C_i$ stored in the second buffer 232 as a valid codeword, that is, a decoded codeword.

When any symbol other than '0' is present among the symbols of the syndrome vector $S_i$, it is determined that the syndrome check has been failed. This means that error correction decoding has failed in the i-th iteration, and thus the node processor 220 may perform an i±1-th iteration when the number of iterations falls within the maximum iteration number I. Here, a check node corresponding to a symbol other than '0' among the symbols of the syndrome vector $S_i$ may be referred to as an "unsatisfied check node (UCN)".

When a codeword is generated, which satisfies constraints for a corresponding parity check matrix, the syndrome checker 230 may output the generated codeword. In an embodiment, when a valid codeword that satisfies constraints for the first parity check matrix H1, the second parity check matrix H2 or the third parity check matrix H3 is generated within the maximum iteration number I, the syndrome checker 230 may output the generated valid codeword as a decoded codeword. For example, the valid codeword may include a partial codeword C1, a codeword C2, a partial codeword C3, or a target codeword C4.

In an embodiment, when a valid codeword that satisfies constraints for the fourth parity check matrix H4, e.g., a parity codeword C5, is generated within the maximum iteration number I, the syndrome checker 230 may provide the generated valid codeword to the decoding controller 240.

When a codeword satisfying constraints for a corresponding parity check matrix is not generated within the maximum iteration number I, the syndrome checker 230 may notify the failure of the decoding operation. In an embodiment, when a valid codeword that satisfies constraints for the first parity check matrix H1, e.g., a partial codeword C1 or a partial codeword C3, is not generated within the maximum iteration number I, the syndrome checker 230 may notify the decoding controller 240 that first error correction decoding has failed.

In an embodiment, when a valid codeword that satisfies constraints for the second parity check matrix H2 or the third parity check matrix H3, e.g., a codeword C2 or a target codeword C4, is not generated within the maximum iteration number I, the syndrome checker 230 may output a fail signal indicating that second error correction decoding or third error correction decoding has failed.

In an embodiment, when a valid codeword that satisfies constraints for the fourth parity check matrix H4, e.g., a parity codeword C5, is not generated within the maximum iteration number I, the syndrome checker 230 may notify the decoding controller 240 that first sub-error correction decoding has failed.

The decoding controller 240 may control the mapper 210 and the node processor 220 so that error correction decoding may be performed.

In an embodiment, when notification that first error correction decoding corresponding to the partial codeword C1 has failed is received from the syndrome checker 230, the decoding controller 240 may control the mapper 210 and the node processor 220 so that second error correction decoding corresponding to the codeword C2 may be performed. For example, the decoding controller 240 may control the mapper 210 so that the mapper 210 further receives read values Rα corresponding to the second parity part Pα of the codeword C2 and then determines initial values corresponding to the codeword C2. The decoding controller 240 may control the node processor 220 so that the node processor 220 uses the first parity check matrix H1 when performing first error correction decoding and uses the second parity check matrix H2 when performing second error correction decoding.

In an embodiment, when notification that first error correction decoding corresponding to the partial codeword C3 has failed is received from the syndrome checker 230, the decoding controller 240 may control the mapper 210 and the node processor 220 so that third error correction decoding corresponding to the target codeword C4 may be performed. As described above, third error correction decoding may include first sub-error correction decoding and second sub-error correction decoding.

For example, when notification that first error correction decoding corresponding to the partial codeword C3 has failed is received from the syndrome checker 230, the decoding controller 240 may control the mapper 210 so that the mapper 210 receives read values R5 corresponding to a parity codeword C5 and then determines initial values to be used for first sub-error correction decoding. The decoding controller 240 may control the node processor 220 so that the node processor 220 uses a fourth parity check matrix H4 when performing first sub-error correction decoding.

In an embodiment, when notification that first sub-error correction decoding corresponding to the parity codeword C5 has failed is received from the syndrome checker 230, the decoding controller 240 may control the mapper 210 so that the mapper 210 selects read values Rβ, corresponding to the second parity part Pβ of the target codeword C4, from a plurality of read values Rβ included in read values R5 corresponding to the parity codeword C5. The decoding controller 240 may control the mapper 210 so that the mapper 210 determines initial values to be used for second sub-error correction decoding using the read values R3 corresponding to the partial codeword C3 and the selected read values Rβ. The decoding controller240 may control the node processor 220 so that the node processor uses a third parity check matrix H3 when performing second sub-error correction decoding.

In an embodiment, when the parity codeword C5 is received from the syndrome checker 230, the decoding controller 240 may select a second parity part Pβ, corresponding to the target codeword C4, from a plurality of second parity parts Pβ included in the received codeword C5, and may provide the selected second parity part Pβ to the mapper 210. The decoding controller 240 may control the mapper 210 so that the mapper 210 determines initial values to be used for second sub-error correction decoding using the read values R3 corresponding to the partial codeword C3 and the selected second parity part pp.

Meanwhile, although not illustrated in the drawing, the error correction circuit 10 may further include a post processor configured to support the error correction decoder 200 so that the error correction decoder 200 can generate a valid codeword. For example, the post processor may support the error correction decoder 200 so that various types of parameters used for error correction decoding are modified and error correction decoding is performed using the modified parameters.

Figure 11:
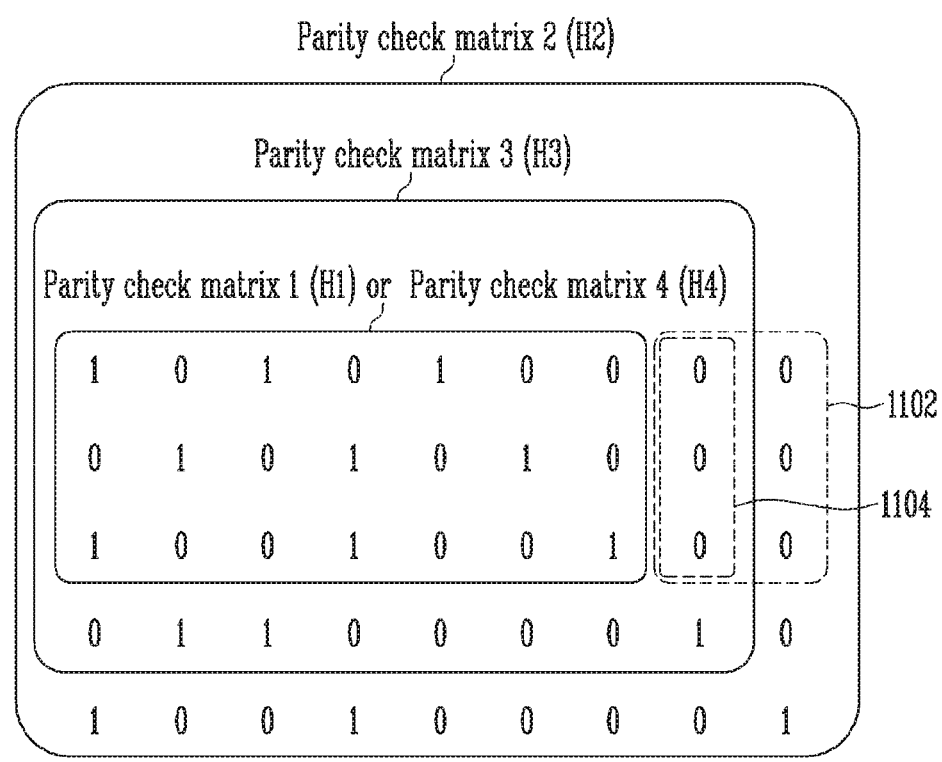
FIG. 11 is a diagram illustrating a parity check matrix according to an embodiment of the disclosed technology.

FIG. 11 is a diagram illustrating a parity check matrix according to an embodiment of the disclosed technology.

An (n, k) code may be defined as a parity check matrix having a size of (n−k)×n. Here, k denotes the length of a message, and n−k denotes the number of parity bits. Each entry of the parity check matrix may be represented by '0' or '1', and the (n, k) code may be referred to as an "(n, k) LDPC code" when the number of 1 included in the parity check matrix is much less than the number of 0. Here, n and k may be natural numbers.

In FIG. 11, as an example, a first parity check matrix H1 and a fourth parity check matrix H4 that define (7, 4) code, a third parity check matrix H3 that defines (8, 4) code, and a second parity check matrix that defines (9, 4) code are illustrated.

A matrix in which each entry is implemented as a sub-matrix may be referred to as a 'base matrix'. Each entry of the base matrix may be a sub-matrix having an m×m size. Here, m may be an integer of 2 or more. For example, '0' in the base matrix may indicate that the corresponding entry is a zero matrix, and '1' in the base matrix may indicate that the corresponding entry is not a zero matrix. For example, when the base matrix is used for a Quasi Cyclic (QC)-LDPC code, '1' may indicate that the corresponding entry is a circulant matrix. The circulant matrix may be a matrix obtained by cyclically shifting an identity matrix by a predetermined shift value, and any one circulant matrix may have a shift value different from that of another circulant matrix.

Mean a generator matrix for the (n, k) code may have a k×n size, and may correspond to the parity check matrix of the (n, k) code. The relationship between the generator matrix and the parity check matrix may be represented by the following Equation (2):

$$GH^T = O \qquad (2)$$

Here, G denotes a generator matrix and $H^T$ denotes a transposed matrix of a parity check matrix.

In an embodiment, the first parity check matrix H1 corresponding to a first code rate of k/n may be included in at least one of a second parity check matrix H2 corresponding to a second code rate of k/(n+α) or a third parity check matrix H3 corresponding to a third code rate of k/(n+β).

In an embodiment, the third parity check matrix H3 may be included in the second parity check matrix H2 or may not be included therein.

In an embodiment, a fourth parity check matrix H4 may be included in the second parity check matrix H2 or the third parity check matrix H3, or may not be included in the second parity check matrix H2 and the third parity check matrix H3. As described above, if u=k, the fourth parity check matrix H4 may be equal to the first parity check matrix and at this time, the fourth parity check matrix H4 may be included in at least one of the second parity check matrix H2 or the third parity check matrix H3. Thus, the fourth parity check matrix H4 may be a subset of the second parity check matrix H2 or the third parity check matrix H3.

In an embodiment, certain entries of the second parity check matrix H2 may be zero entries. For example, among entries that are included in the second parity check matrix H2 but are not included in the first parity check matrix H1, all entries 1102 disposed in rows included in the first parity check matrix H1 may be '0'. In other words, when the second parity check matrix H2 has a size of (n−k+α)×(n+α), the first parity check matrix H1 having a size of (n−k)×n may be disposed in rows and columns of the second parity check matrix H2, ranging from a first row and a first column to an n-k-th row and an n-th column. Here, among the entries of the second parity check matrix H2, the entries 1102 disposed in rows and columns ranging from the first row and the n+1-th column to the n-k-th row and an n+α-th column may be '0'.

Similarly, certain entries of the third parity check matrix H3 may be zero entries. For example, among entries that are included in the third parity check matrix H3 but are not included in the first parity check matrix H1, all entries 1104 disposed in rows included in the first parity check matrix H1 may be '0'. In other words, when the third parity check matrix H3 has a size of (n−k+β)×(n+β), the first parity check matrix H1 having a size of (n−k)×n may be disposed in rows and columns of the third parity check matrix H3 ranging from a first row and a first column to an n-k-th row and an n-th column. Here, among the entries of the third parity check matrix H3, the entries 1104 disposed in rows and columns ranging from a first row and a n+1-th column to a n-k-th row and a n+β-th column may be '0'.

Figures 12, 13:
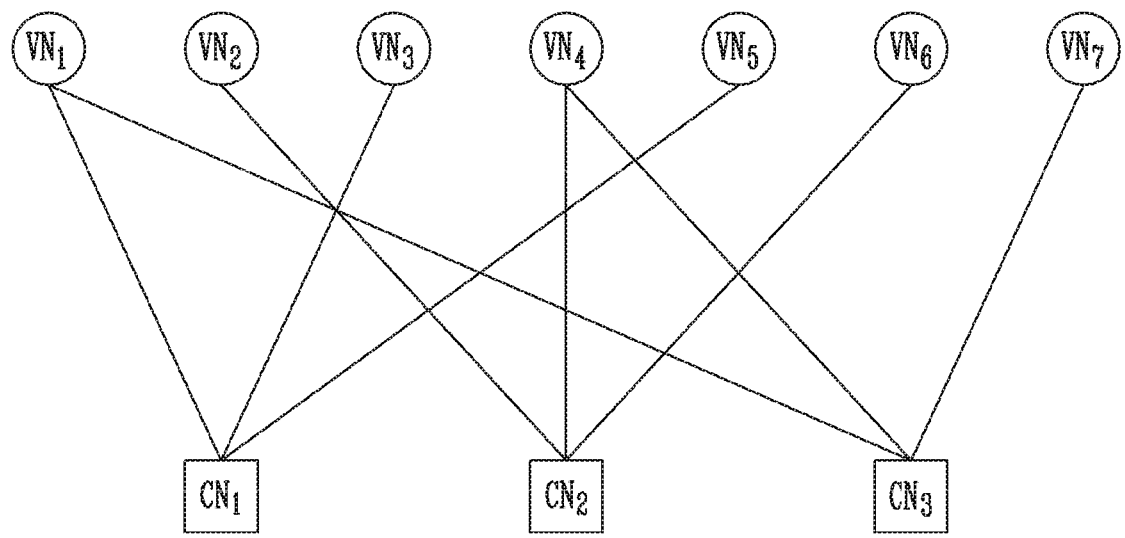
FIG. 12 is a diagram illustrating a first parity check matrix of FIG. 11 as a Tanner graph.
FIG. 13 is an example diagram for explaining a syndrome vector calculated using the first parity check matrix of FIG. 11.

FIG. 12 is a diagram illustrating the first parity check matrix of FIG. 11 as a Tanner graph.

An (n, k) code may be represented by a Tanner graph which is a representation of an equivalent bipartite graph. The Tanner graph may be represented by n−k check nodes, n variable nodes, and edges. The check nodes correspond to rows of the parity check matrix, and the variable nodes correspond to columns of the parity check matrix. Each edge couples one check node to one variable node, and indicates an entry represented by '1' in the parity check matrix.

The first parity check matrix of the (7, 4) code illustrated in FIG. 11 may be represented by a Tanner graph including three check nodes $CN_1$ to $CN_3$ and seven variable nodes $VN_1$ to $VN_7$, as illustrated FIG. 12. Solid lines for coupling the check nodes $CN_1$ to $CN_3$ to the variable nodes $VN_1$ to $VN_7$ indicate edges.

Iterative decoding may be performed based on an iterative message passing algorithm between the heck nodes $CN_1$ to $CN_3$ and the variable nodes $VN_1$ to $VN_7$ on the Tanner graph, as illustrated in FIG. 12. That is, in each iteration, iterative decoding may be performed while messages are transferred between the check nodes $CN_1$ to $CN_3$ and the variable nodes $VN_1$ to $VN_7$.

The variable nodes may perform error correction using Check to Variable (C2V) messages received from the check nodes coupled thereto. The variable nodes may generate V2C messages to be sent to the check nodes coupled thereto, and may send the generated V2C messages to the corresponding check nodes, respectively.

The check nodes may perform a parity check using Variable to Check (V2C) messages received from the variable nodes coupled thereto. In the parity check, sign bits included in the V2C messages may be used. The check nodes may generate C2V messages to be sent to the variable nodes coupled thereto, and may send the generated C2V messages to the corresponding variable nodes, respectively.

FIG. 13 is an example diagram for explaining a syndrome vector calculated using the first parity check matrix illustrated in FIG. 11.

As described above, a syndrome vector $S_i$ may be generated based on a parity check matrix H and a transposed matrix $C_i^T$ of a variable node vector $C_i$ corresponding to an i-th iteration. Symbols $(C_{i1}, C_{i2}, C_{i3}, \ldots, C_{i7})$ of the variable node vector $C_i$ indicate the values of variable nodes corresponding to an i-th iteration. Here, i is a natural number. The symbols $S_{i1}$, $S_{i2}$, and $S_{i3}$ of the syndrome vector $S_i$ correspond to respective check nodes $CN_1$, $CN_2$, and $CN_3$ on the Tanner graph illustrated in FIG. 12.

A case where all of the symbols $S_{i1}$, $S_{i2}$, and $S_{i3}$ of the syndrome vector $S_i$ indicate '0' means that the syndrome check has passed. This means that error correction decoding has been successfully performed in the corresponding iteration. Therefore, iterative decoding for the corresponding codeword may be terminated, and the variable node vector $C_i$ corresponding to the i-th iteration may be output as a decoded codeword.

A case where at least one of the symbols $S_{i1}$, $S_{i2}$, and $S_{i3}$ of the syndrome vector $S_i$ is not '0' means that the syndrome check has failed. This means that error correction decoding has not succeeded in the corresponding iteration. Therefore, when the number of iterations does not reach the maximum iteration number, a next iteration may be performed. Here, the symbol other than '0' may indicate an Unsatisfied Check Node (UCN).

Figure 14:
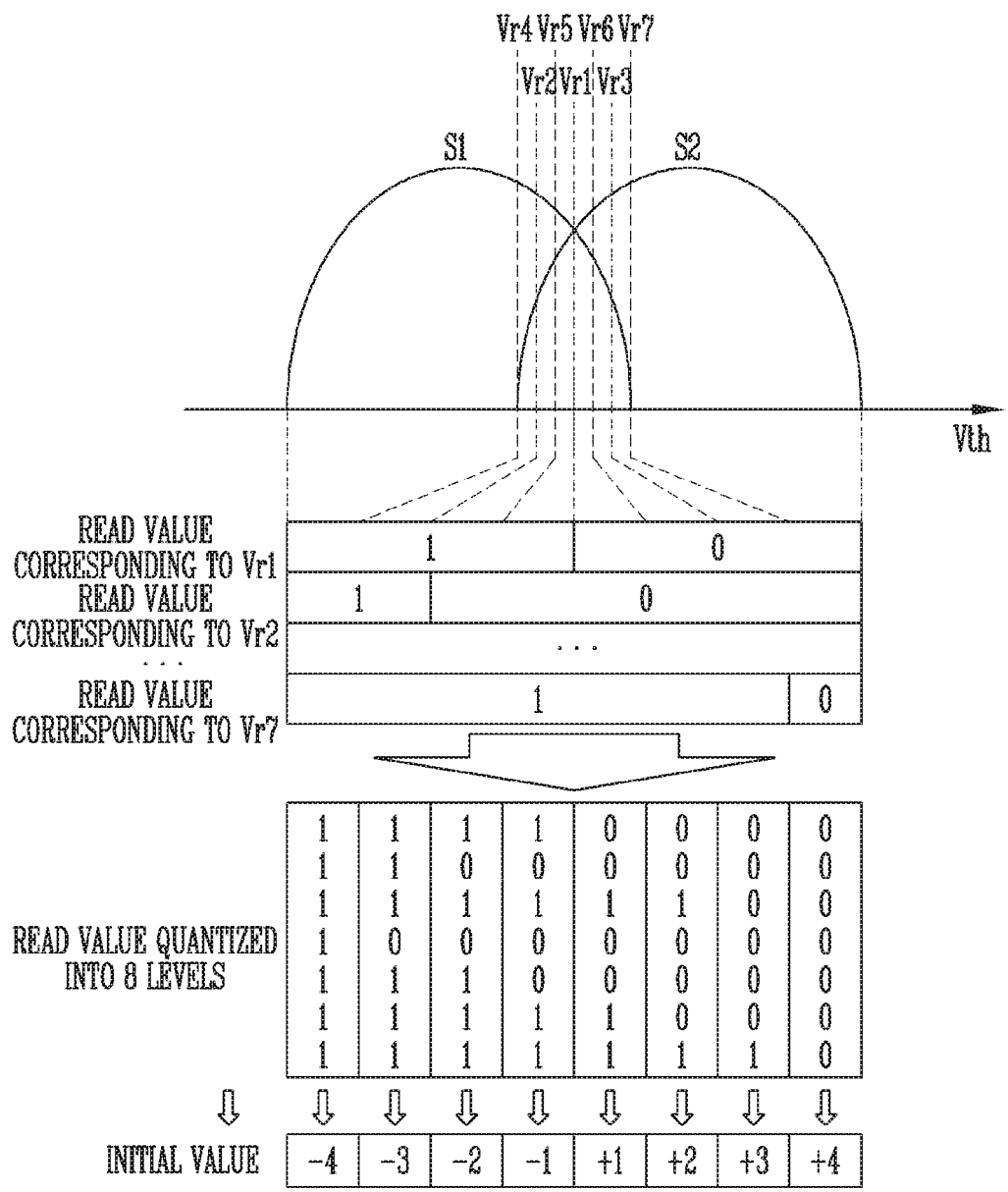
FIG. 14 is an example diagram illustrating a procedure for generating initial values using g read values in soft-decision decoding.

FIG. 14 is an example diagram illustrating a procedure for generating initial values using g read values in soft-decision decoding.

In FIG. 14, threshold voltage (Vth) distributions of memory cells having any one of a first state S1 and a second state S2 are illustrated.

When quantization level g+1 is used, g read voltages may be sequentially applied to a plurality of memory cells in order to acquire g read vectors corresponding to a single codeword. Here, g may be a natural number. For example, when quantization level 2 is used, one read voltage Vr1 may be applied, and when quantization level 3 is used, two read voltages Vr1 and Vr2 may be sequentially applied. Similarly, as illustrated in FIG. 14, when quantization level 8 is used, seven read voltages Vr1, Vr2, Vr3, Vr4, Vr5, Vr6, and Vr7 may be sequentially applied. This means that, when quantization level g+1 is used, g read voltages may be applied to each memory cell, and thus g read values may be acquired from each memory cell.

When any one of the g read voltages is applied to the plurality of memory cells, a read value from a memory cell having a threshold voltage lower than the applied read voltage may appear as '1', and a read value from a memory cell having a threshold voltage higher than the applied read voltage may appear as '0'.

The error correction circuit may generate read values quantized into g+1 levels by combining read values respectively corresponding to the g read voltages. For example, as illustrated in FIG. 14, when seven read voltages Vr1, Vr2, Vr3, Vr4, Vr5, Vr6, and Vr7 are used, the error correction circuit may generate read values quantized into eight levels by combining read values respectively corresponding to the seven read voltages Vr1, Vr2, Vr3, Vr4, Vr5, Vr6, and Vr7.

The error correction circuit may convert the read values, quantized into g+1 levels, into initial values (e.g., LLR values). Conversion into the initial values may be performed by referring to a lookup table that is preset.

FIG. 15 is an example diagram for explaining a lookup table.

Referring to FIG. 15, the lookup table may define values respectively corresponding to a plurality of quantization levels.

The error correction circuit may convert each of read values, quantized into g+1 quantization levels, into any one of g+1 LLR values corresponding to the quantization level g+1, with reference to the lookup table.

For example, when quantization level 2 is used, the error correction circuit may convert two read values quantized into two levels, into a value of LLR1 and a value of LLR2. For example, of the read values quantized into two levels, may be converted into a value of LLR1, e.g., '−4', and '0' may be converted into a value of e.g., '+4'.

In embodiments of the disclosed technology, the term "read values" means read values quantized into g+1 levels.

Figure 16:
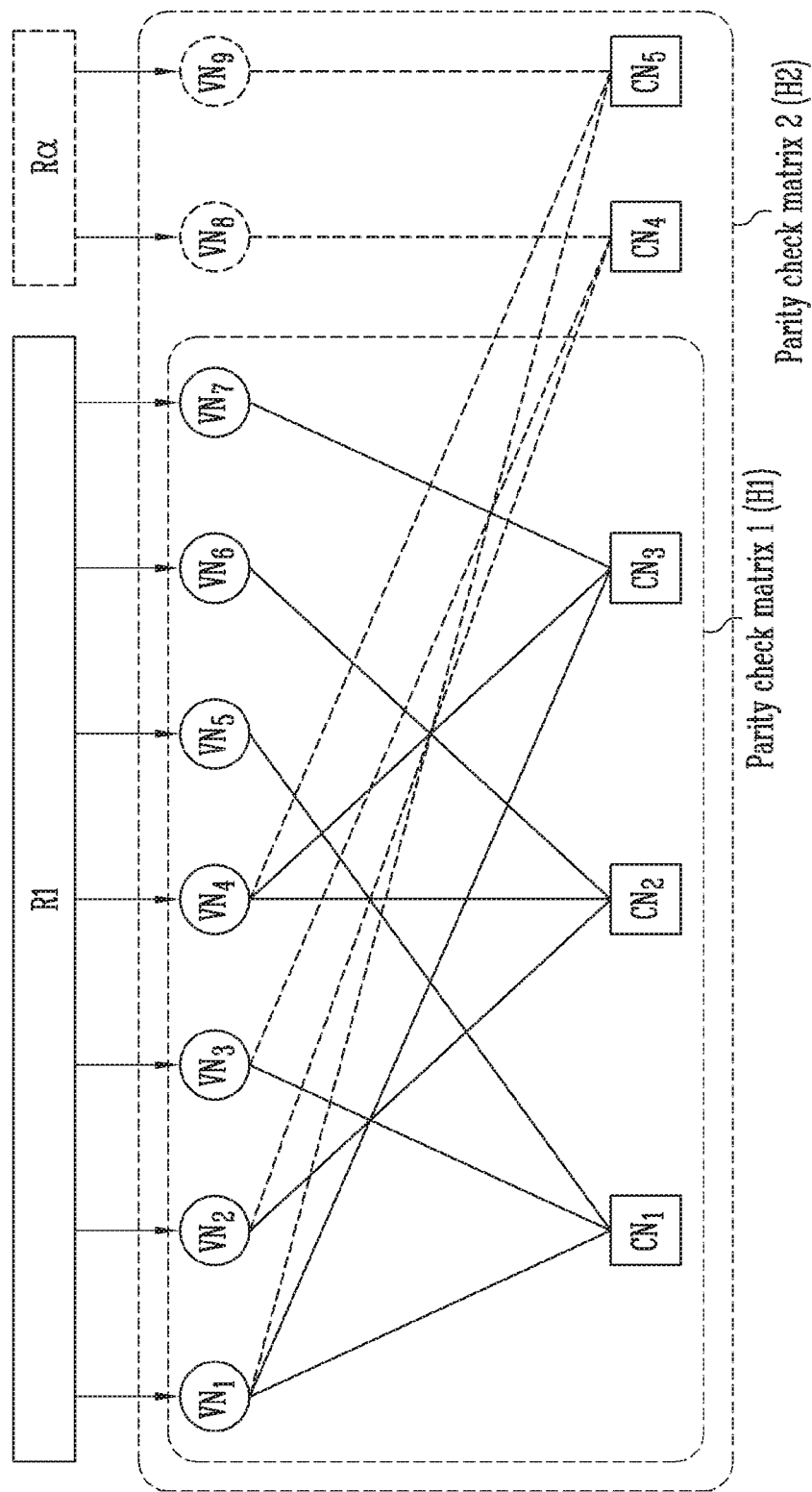
FIG. 16 is an example diagram for explaining initial values assigned to variable nodes when a first code rate of k/n or a second code rate of k/(n+α) is used according to an embodiment of the disclosed technology.

FIG. 16 is an example diagram for explaining initial values assigned to variable nodes when a first code rate of k/n or a second code rate of k/(n+α) is used according to an embodiment of the disclosed technology.

When first error correction decoding is performed at the first code rate of k/n, initial values may be assigned to variable nodes $VN_1$ to $VN_7$ corresponding to a first parity check matrix H1. Here, initial values determined based on read values R1 corresponding to a partial codeword C1 may be assigned to the variable nodes $VN_1$ to $VN_7$.

When second error correction decoding is performed at a second code rate of k/(n+a), initial values may be assigned to variable nodes $VN_1$ to $VN_9$ corresponding to a second parity check matrix H2. Here, initial values determined based on the read values R1 corresponding to the partial codeword C1 may be assigned to the variable nodes $VN_1$ to $VN_9$, and initial values determined based on read values Ra corresponding to a second parity part Pa of a codeword C2 may be assigned to variable nodes $VN_8$ and $VN_9$.

Figure 17:
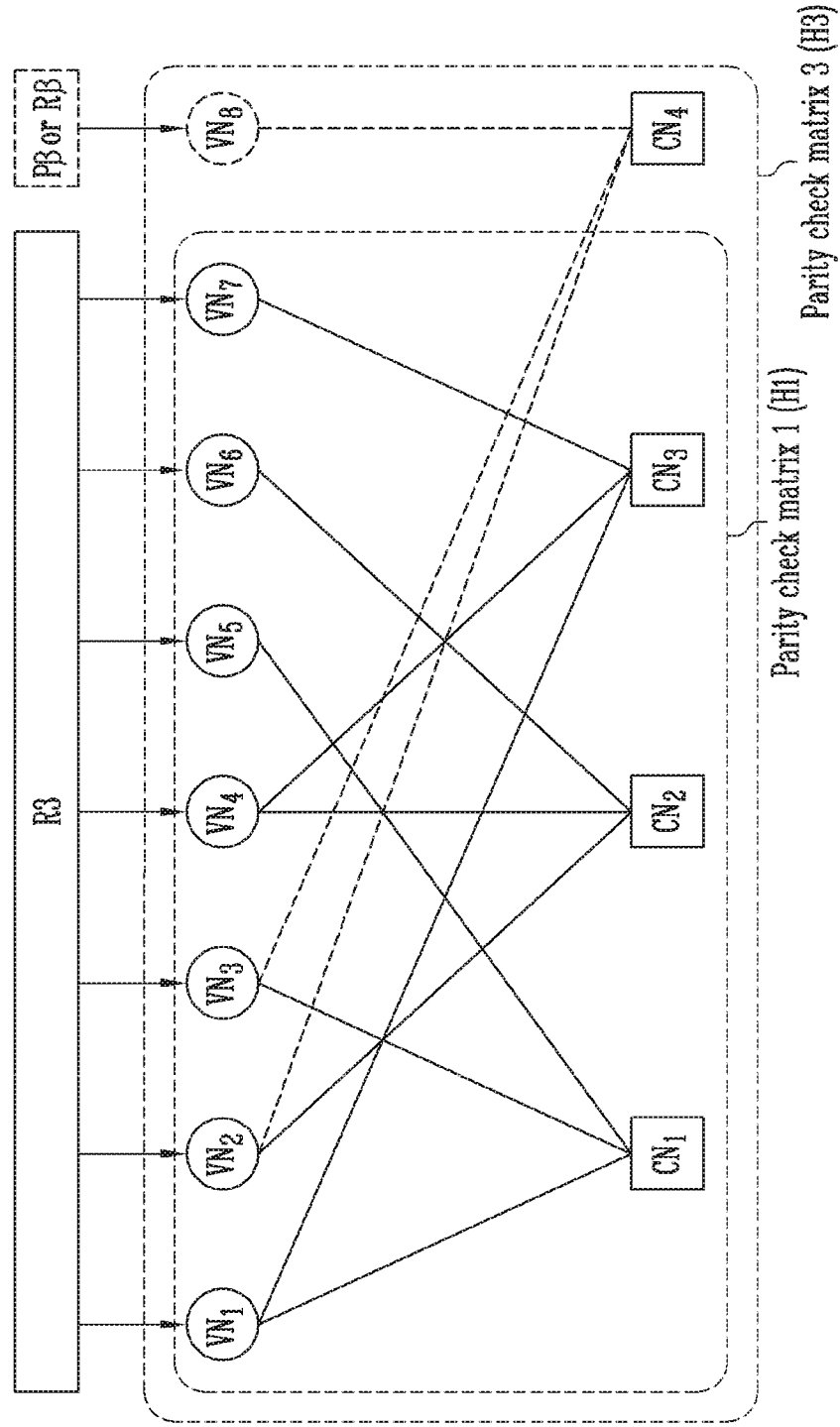
FIG. 17 is an example diagram for explaining initial values assigned to variable nodes when a first code rate of k/n or a third code rate of k/(n+β) is used according to an embodiment of the disclosed technology.

FIG. 17 is an example diagram for explaining initial values assigned to variable nodes when a first code rate of k/n or a third code rate of k/(n+β) is used according to an embodiment of the disclosed technology.

When first error correction decoding is performed at a first code rate of k/n, initial values may be assigned to variable nodes $VN_1$ to $VN_7$ corresponding to a first parity check matrix H1. Here, initial values determined based on read values R3 corresponding to a partial codeword C3 may be assigned to the variable nodes $VN_1$ to $VN_7$.

When third error correction decoding is performed at a third code rate of k/(n+β), initial values may be assigned to variable nodes $VN_1$ to $VN_8$ corresponding to a third parity check matrix H3. Here, initial values determined based on read values R3 corresponding to a partial codeword C3 may be assigned to variable nodes $VN_1$ to $VN_7$. Here, an initial value determined based on read values R3 corresponding to a second parity part Pβ of a codeword C4 may be assigned to the variable node $VN_8$. Alternatively, an initial value determined based on the second parity part Pβ of the codeword C4 may be assigned to the variable node $VN_8$.

When the initial value determined based on the second parity part $P_\beta$ is assigned to the variable node $VN_8$, V2C messages to be sent from the variable node $VN_8$ in all iterations may be determined regardless of C2V messages that are input to the variable node $VN_8$. That is, in all iterations, the V2C messages to be sent from the variable node $VN_8$ may be determined based on only the initial value assigned to the variable node $VN_8$. Further, regardless of the C2V messages that are input to the variable node $VN_8$, the value of the variable node $VN_8$ may not be updated.

FIG. 18 is a flowchart illustrating an example process in which the error correction circuit of FIG. 10 performs error correction encoding.

In an embodiment to be described with reference to FIG. 18, a case where additional error correction encoding is not performed on second parity parts Pα is described.

At step 1801, the error correction circuit may externally receive a message that is to be the target of error correction encoding. The received message may be a k-bit message.

At step 1803, the error correction circuit may generate an n+α-bit codeword C2 by performing error correction encoding on the k-bit message at a second code rate. The n+α-bit codeword C2 may include an n-bit partial codeword C1 and an α-bit second parity part Pα.

FIG. 19 is a flowchart illustrating an example process in which the error correction circuit of FIG. 10 performs error correction decoding.

In an embodiment to be described with reference to FIG. 19, a case where additional error correction encoding is not performed on second parity parts Pα is assumed.

At step 1901, the error correction circuit may receive n-bit read values R1 corresponding to a partial codeword C1.

At step 1903, the error correction circuit may perform first error correction decoding at a first code rate. For example, the error correction circuit may perform first error correction decoding using a first parity check matrix H1 having a size of (n−k)×n and the n-bit read values R1.

At step 1905, the error correction circuit may determine whether first error correction decoding has passed (i.e., been successful). For example, the error correction circuit may determine whether a valid codeword that satisfies constraints for the first parity check matrix H1 has been generated within the maximum number of iterations (i.e., the maximum iteration number).

When it is determined at step 1905 that first error correction decoding has passed (in case of Y), the process proceeds to step 1915 to output a decoded codeword.

When it is determined at step 1905 that first error correction decoding has failed (in case of N), the process may proceed to step 1907.

At step 1907, the error correction circuit may receive α-bit read values Rα corresponding to a second parity part Pα.

At step 1909, the error correction circuit may determine initial values to be used for second error correction decoding using the n-bit read values R1 corresponding to the partial codeword C1 and the α-bit read values Rα corresponding to the second parity part Pα.

At step 1911, the error correction circuit may perform second error correction decoding at a second code rate. For example, the error correction circuit may perform second error correction decoding using a second parity check matrix H2 having a size of (n−k+α)×(n+α) and the initial values determined at step 1909.

At step 1913, the error correction circuit may determine whether second error correction decoding has passed. For example, the error correction circuit may determine whether a valid codeword that satisfies constraints for the second parity check matrix H2 has been generated within the maximum iteration number.

When it is determined at step 1913 that second error correction decoding has passed (in case of Y), the process proceeds to step 1915 where a decoded codeword may be output.

When it is determined at step 1913 that second error correction decoding has failed (in case of N), the process proceeds to step 1917 to output a fail signal indicating that error correction decoding has failed.

Figure 20:
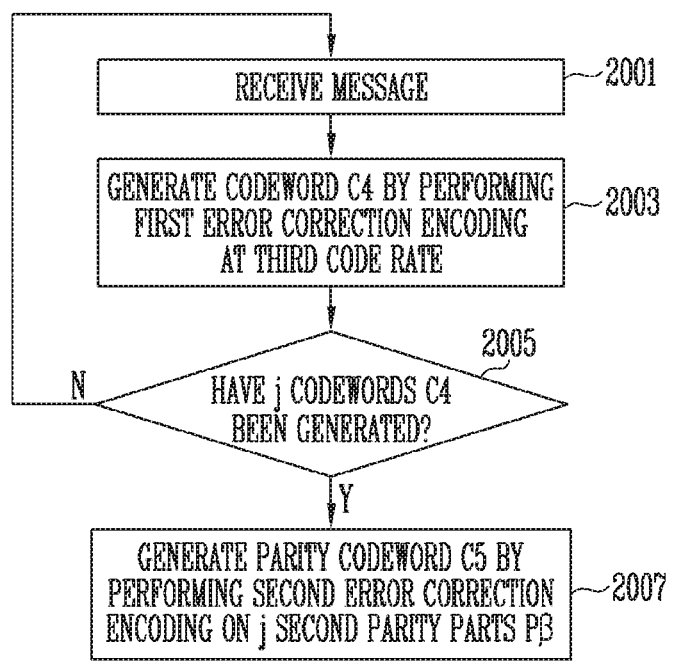
FIG. 20 is a flowchart illustrating an example process in which the error correction circuit of FIG. 10 performs error correction encoding.

FIG. 20 is a flowchart illustrating an example process in which the error correction circuit of FIG. 10 performs error correction encoding.

In an embodiment to be described with reference to FIG. 20, a case where additional error correction encoding is performed on second parity parts Pβ is described.

At step 2001, the error correction circuit may externally receive a message that is the target of error correction encoding. The received message may be a k-bit message.

At step 2003, the error correction circuit may generate an n+β-bit codeword C4 by performing first error correction encoding on the k-bit message at a third code rate. The n+β-bit codeword C4 may include an n-bit partial codeword C3 and a β-bit second parity part Pβ.

At step 2005, the error correction circuit may determine whether a set number of codewords C4 have been generated. For example, the error correction circuit may determine whether j codewords C4 have been generated. As a result of the determination at step 2005, when j codewords C4 have been generated (in case of Y), the process may proceed to step 2007, otherwise (in case of N) the process may return to step 2001.

At step 2007, the error correction circuit may generate an n-bit parity codeword C5 by performing second error correction encoding on j second parity parts Pβ corresponding to the j codewords C4. The n-bit parity codeword. C5 may include a u-bit second parity part area Pβsa and an n–u-bit third parity part PPoP.

Figure 21:
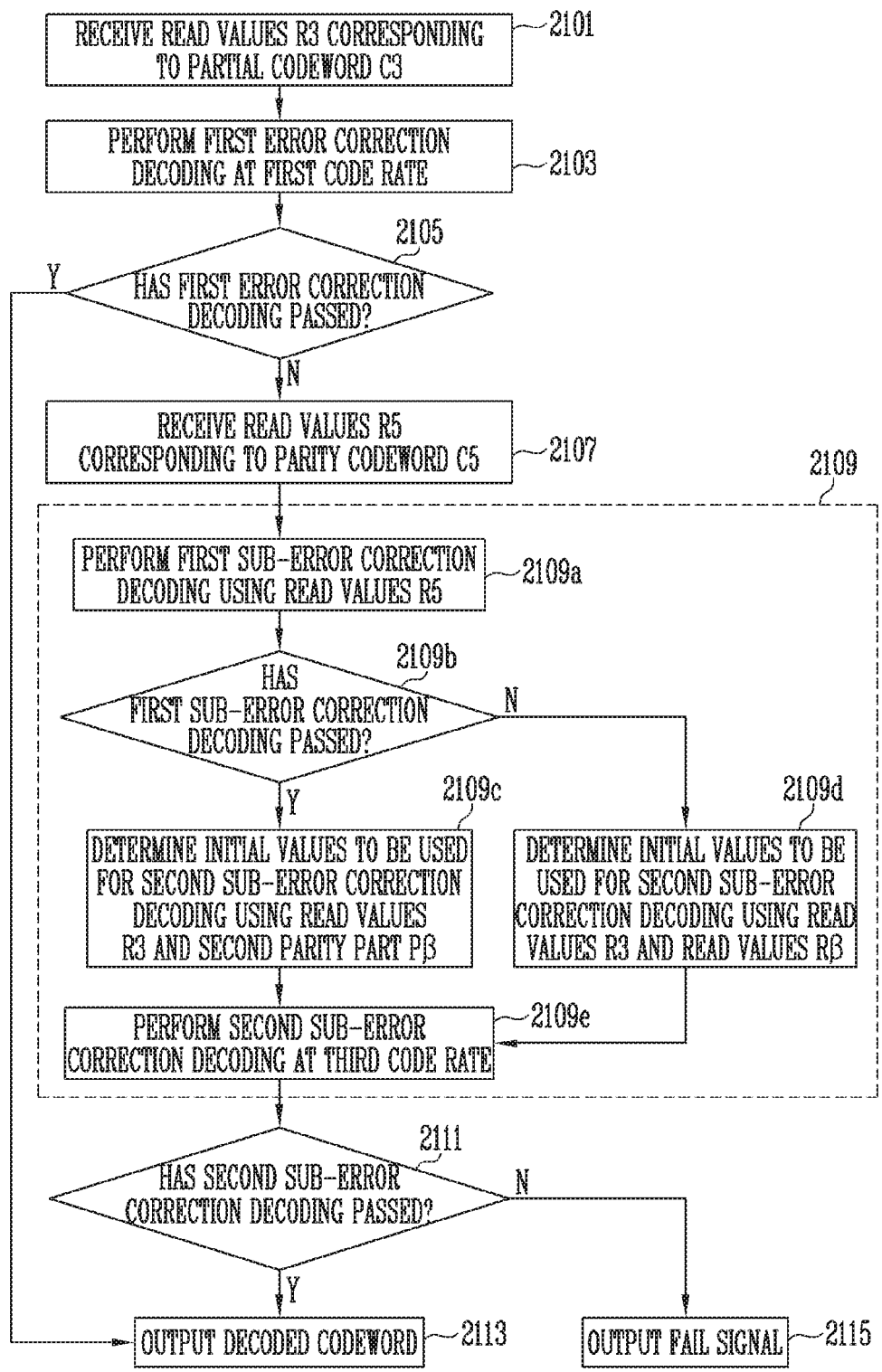
FIG. 21 is a flowchart illustrating an example process in which the error correction circuit of FIG. 10 performs error correction decoding.

FIG. 21 is a flowchart illustrating an example process in which the error correction circuit of FIG. 10 performs error correction decoding.

In an embodiment to be described with reference to FIG. 21, a case where additional error correction encoding is performed on second parity parts Pβ is assumed.

At step 2101, the error correction circuit may receive n-bit read values R3 corresponding to a partial codeword C3.

At step 2103, the error correction circuit may perform first error correction decoding at a first code rate of k/n. For example, the error correction circuit may perform first error correction decoding using a first parity check matrix H1 having a size of (n–k)/n and n-bit read values R3.

At step 2105, the error correction circuit may determine whether first error correction decoding has passed. For example, the error correction circuit may determine whether a valid codeword that satisfies constraints for the first parity check matrix H1 has been generated within the maximum number of iterations (i.e., the maximum iteration number).

When it is determined at step 2105 that first error correction decoding has passed (in case of Y), the process proceeds to step 2113 where a decoded codeword may be output.

When it is determined at step 2105 that first error correction decoding has failed (in case of N), the process may proceed to step 2107.

At step 2107, the error correction circuit may receive read values R5 corresponding to a parity codeword C5.

At step 2109, the error correction circuit may perform third error correction decoding at a third code rate of k/(n+β). Step 2109 may include steps 2109a to 2109e.

At step 2109a, the error correction circuit may perform first sub-error correction decoding using the read values R5 corresponding to the parity codeword C5. For example, the error correction circuit may perform first sub-error correction decoding using a fourth parity check matrix H4 having a size of (n–u)×n and the n-bit read values R5.

At step 2109b, the error correction circuit may determine whether first sub-error correction decoding has passed. For example, the error correction circuit may determine whether a valid codeword that satisfies constraints for the fourth parity check matrix H4 has been generated within the maximum iteration number.

As a result of the determination at step 2109b, when first sub-error correction decoding has passed (in case of Y), the process may proceed to step 2109c, otherwise (in case of N) the process may proceed to step 2109d.

At step 2109c which is performed when first sub-error correction decoding has passed, the error correction circuit may determine initial values to be used for second sub-error correction decoding using the read values R3 corresponding to the partial codeword C3 and a second parity part 113 corresponding to the partial codeword C3. Here, the error correction circuit may select a second parity part Pβ corresponding to the partial codeword C3 from a plurality of second parity parts Pβ included in the decoded parity codeword C5.

At step 2109d which is performed when first sub-error correction decoding has failed, the error correction circuit may determine initial values to be used for second sub-error correction decoding using the read values R3 corresponding to the partial codeword C3 and the read values Rβ corresponding to the second parity part Pβ. Here, the error correction circuit may select read values Rβ corresponding to the partial codeword. C3 from a plurality of read values Rβ included in the read values R5 corresponding to the parity codeword C5.

At step 2109e, the error correction circuit may perform second sub-error correction decoding at a third code rate. For example, the error correction circuit may perform second sub-error correction decoding using a third parity check matrix H3 having a size of (n–k+β)×(n+β) and the initial values determined at step 2109c or 2109d.

At step 2111, the error correction circuit may determine whether second sub-error correction decoding has passed. For example, the error correction circuit may determine whether a valid codeword that satisfies constraints for the third parity check matrix H3 has been generated within the maximum iteration number.

When it is determined at step 2111 that second sub-error correction decoding has passed (in case of Y), the process proceeds to step 2113 to output a decoded codeword.

When it is determined at step 2111 that second sub-error correction decoding has failed, the process proceeds to step 2115 where a fail signal indicating that error correction decoding has failed may be output.

Figure 22:
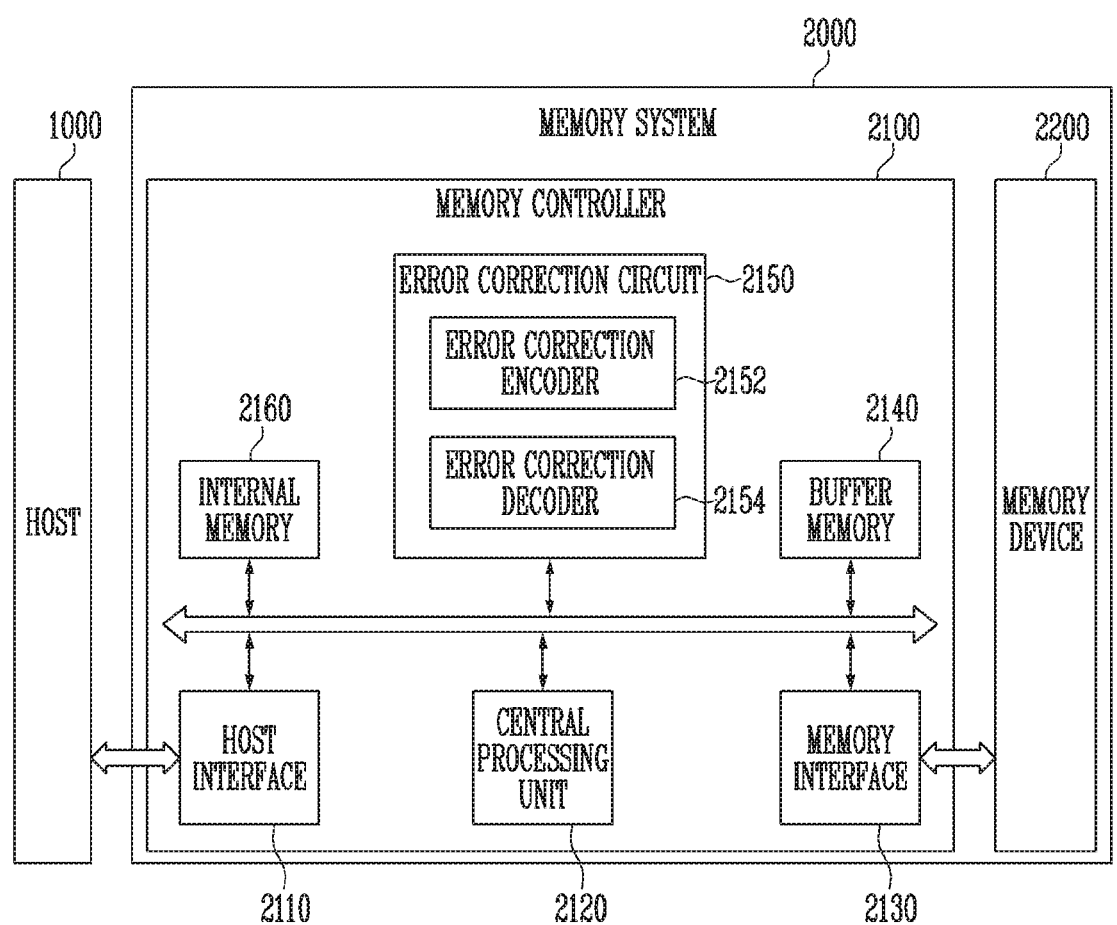
FIG. 22 is a diagram illustrating a memory system according to an embodiment of the disclosed technology.

FIG. 22 is a diagram illustrating a memory system according to an embodiment of the disclosed technology.

Referring to FIG. 22, a memory system 2000 may include a memory device 2200 which stores data, and a memory controller 2100 which controls the memory device 2200 under the control of a host 1000.

The host 1000 may be a device or a system that includes one or more computer processors which operate to retrieve digital information or data from the memory system 2000 or store or write digital information or data into the memory system 2000. In various applications, the host 1000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box.

The memory controller 2100 may control the overall operation of the memory system 2000. The memory controller 2100 may perform various operations in response to requests received from the host 1000. For example, the memory controller 2100 may perform a program operation, a read operation, an erase operation, etc. on the memory device 2200. During a program operation, the memory controller 2100 may transmit a program command, an address, error correction-encoded data, etc. to the memory device 2200. During a read operation, the memory controller 2100 may transmit a read command, an address, etc. to the memory device 2200, and may receive read data corresponding to error correction-encoded data from the memory device 2200. During an erase operation, the memory controller 2100 may provide an erase command, an address, etc. to the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may transfer a program request, a read request, and an erase request, received from the host 1000, to the CPU 2120. During a program operation, the host interface 2110 may receive original data corresponding to the program request from the host 1000, and may store the received original data in the buffer memory 2140. During a read operation, the host interface 2110 may transmit error correction-decoded data stored in the buffer memory 2140 to the host 1000. The host interface 2110 may communicate with the host 1000 using various interface protocols. For example, the host interface 2110 may communicate with the host 1000 using at least one of interface protocols, such as Non-Volatile Memory express (NVMe), Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), integrated Drive Electronics (IDE), Mobile Industry Processor Interface (MIPI), Universal Flash Storage (UFS), Small Computer System Interface (SCSI), or serial attached SCSI (SAS), but embodiments of the disclosed technology are not limited thereto.

The CPU 2120 may perform various types of calculations (operations) or generate commands and addresses so as to control the memory device 2200. For example, the CPU 2120 may generate various commands and addresses required for a program operation, a read operation, and an erase operation in response to requests received from the host interface 2110.

In an embodiment, when the program request is received, the CPU 2120 may control the error correction circuit 2150 so that error correction encoding is performed on the original data stored in the buffer memory 2140. When notification that error correction-encoded data has been generated is received from the error correction circuit 2150, the CPU 2120 may generate a program command and a physical address, and may control the memory interface 2130 so that the generated program command and physical address and the error correction-encoded data, stored in the buffer memory 2140, are transmitted to the memory device 2200.

When first error correction encoding is performed using a second code rate of $k/(n+\alpha)$, the CPU 2120 may generate a program command and a physical address so that a partial codeword C1 and a second parity part P$\alpha$ of a codeword C2 are stored in different storage areas (e.g., different pages, different chunks, or different memory blocks). For example, the CPU 2120 may determine a physical address so that the partial codeword C1 is stored in a first page of a first memory block, and may determine a physical address so that the second parity part P$\alpha$ is stored in a second page of the first memory block.

When a partial program scheme is used, the CPU 2120 may generate a program command and a physical address for storing a partial codeword C1 and a second parity part P$\alpha$ whenever a single codeword C2 is generated.

When a partial program scheme is not used, the CPU 2120 may generate a program command and a physical address for storing a plurality of partial codewords C1 and a plurality of second parity parts P$\alpha$ whenever a plurality of codewords C2 are generated.

When first error correction encoding is performed using a third code rate of $k/(n+\beta)$, the CPU 2120 may generate a command and a physical address so that partial codewords C3 of a codeword C4 and a parity codeword C5 corresponding to the codeword C4 are stored in different storage areas (e.g., different pages, different chunks, or different memory blocks). For example, the CPU 2120 may determine a physical address so that a plurality of partial codewords C3 are stored in a first memory block, and may determine a physical address so that the parity codeword. C5 is stored in a second memory block.

In an embodiment, the CPU 2120 may manage a Logical-to-Physical (L2P) table in which a physical address at which each partial codeword C1 or partial codeword C3 is stored is mapped to a logical address included in a program request. The CPU 2120 may update the L2P table based on the physical address at which the partial codeword C1 or the partial codeword C3 is stored.

In an embodiment, the CPU 2120 may manage a codeword table. For example, in the codeword table, a physical address at which each partial codeword C1 is stored may be mapped to a physical address at which a second parity part P$\alpha$ corresponding to the partial codeword C1 is stored. The CPU 2120 may update the codeword table based on the physical address at which the second parity part P$\alpha$ corresponding to the partial codeword C1 is stored. For example, in the codeword table, a physical address at which the partial codeword C3 is stored may be mapped to a physical address at which the parity codeword C5 corresponding to the partial codeword C3 is stored. The CPU 2120 may update the codeword table based on the physical address at which the parity codeword C5 corresponding to the partial codeword C3 is stored.

In an embodiment, when a read request corresponding to a predetermined logical address is received, the CPU 2120 may generate a read command and a physical address, and may control the memory interface 2130 so that the generated read command and physical address are transmitted to the memory device 2200. The CPU 2120 may check a physical address corresponding to a logical address requested to be read with reference to the L2P table.

In an embodiment, when read data is stored in the buffer memory 2140, the CPU 2120 may control the error correction circuit 2150 so that error correction decoding is performed on the read data stored in the buffer memory 2140.

In an embodiment, when notification that first error correction decoding using the read values R1 corresponding to the partial codeword C1 has failed is received from the error correction circuit 2150, the CPU 2120 may generate a read command and a physical address for reading a second parity part P$\alpha$ corresponding to the partial codeword C1, and may control the memory interface 2130 so that the generated read command and physical address are transmitted to the memory device 2200. The CPU 2120 may check a physical address at which the second parity part P$\alpha$ corresponding to the partial codeword C1 is stored, with reference to the codeword table.

In an embodiment, when notification that first error correction decoding using the read values R3 corresponding to the partial codeword C3 has failed is received from the error correction circuit 2150, the CPU 2120 may generate a read command and a physical address for reading a parity codeword C5 corresponding to the partial codeword C1, and may control the memory interface 2130 so that the generated read command and physical address are transmitted to the memory device 2200. The CPU 2120 may check a physical address at which the parity codeword C5 corresponding to the partial codeword C3 is stored, with reference to the codeword table.

In an embodiment, when notification that error correction decoding has passed is received from the error correction circuit 2150, the CPU 2120 may control the host interface 2110 so that the error correction-decoded data stored in the buffer memory 2140 is transmitted to the host 1000.

The memory interface 2130 may communicate with the memory device 2200 using various communication protocols.

During a program operation, the memory interface 2130 may transmit the program command and the address, received from the CPU 2120, and the error correction-encoded data, stored in the buffer memory 2140, to the memory device 2200.

During a read operation, the memory interface 2130 may transmit the read command and the address, received from the CPU 2120, to the memory device 2200. During the read operation, the memory interface 2130 may store pieces of read data, received from the memory device 2200, in the buffer memory 2140, and may notify the CPU 2120 that the pieces of read data have been received.

The buffer memory 2140 may temporarily store data while the memory controller 2100 controls the memory device 2200. For example, during a program operation, original data received from the host 1000 may be temporarily stored in the buffer memory 2140. Further, during a read operation, the read data received from the memory device 2200 may also be temporarily stored in the buffer memory 2140.

In an embodiment, the buffer memory 2140 may receive error correction-encoded data from the error correction circuit 2150, and may store the error correction-encoded data until the error correction-encoded data is transmitted to the memory device 2200. The buffer memory 2140 may receive error correction-decoded data from the error correction circuit 2150, and may store the error correction-decoded data until it is transmitted to the host 1000.

The error correction circuit 2150 may perform error correction encoding during a program operation, and may perform error correction decoding during a read operation. The error correction circuit 2150 may be an error correction circuit that uses an LDPC code. The error correction circuit 2150 may include an error correction encoder 2152 and an error correction decoder 2154.

In an embodiment, the error correction encoder 2152 may perform error correction encoding on original data. The error correction encoder 2152 may store the error correction-encoded data in the buffer memory 2140, and may notify the CPU 2120 that error correction-encoded data has been generated. The basic configuration and operation of the error correction encoder 2152 may be identical to those of the error correction encoder 100, described above with reference to FIG. 10.

The error correction decoder 2154 may perform error correction decoding using the read data received from the memory device 2200. The basic configuration and operation of the error correction decoder 2154 may be identical to those of the error correction decoder 200, described above with reference to FIG. 10.

In an embodiment, when read values R1 corresponding to a partial codeword C1 are received, the error correction decoder 2154 may perform first error correction decoding at a first code rate of k/n. When first error correction decoding passes, the error correction decoder 2154 may store a decoded codeword in the buffer memory 2140, and may notify the CPU 2120 that first error correction decoding has passed. When first error correction decoding fails, the error correction decoder 2154 may notify the CPU 2120 that first error correction decoding has failed.

In an embodiment, when read values Rα corresponding to the second parity part Pα are further received, the error correction decoder 2154 may perform second error correction decoding at a second code rate of k/(n+α). When second error correction decoding passes, the error correction decoder 2154 may store a decoded codeword in the buffer memory 2140, and may notify the CPU 2120 that the second error correction decoding has passed. When second error correction decoding fails, the error correction decoder 2154 may notify the CPU 2120 that the second error correction decoding has failed.

In an embodiment, when read values R3 corresponding to the partial codeword C3 are received, the error correction decoder 2154 may perform first error correction decoding at a first code rate of k/n. When first error correction decoding passes, the error correction decoder 2154 may store a decoded partial codeword C3 in the buffer memory 2140, and may notify the CPU 2120 that first error correction decoding has passed. When first error correction decoding fails, the error correction decoder 2154 may notify the CPU 2120 that first error correction decoding has failed.

In an embodiment, when read values R5 corresponding to a parity codeword C5 are further received, the error correction decoder 2154 may perform third error correction decoding at the third code rate. When third error correction decoding passes, the error correction decoder 2154 may store a decoded codeword in the buffer memory 2140, and may notify the CPU 2120 that third error correction decoding has passed. When third error correction decoding fails, the error correction decoder 2154 may notify the CPU 2120 that third error correction decoding has failed.

The internal memory 2160 may be used as a storage unit which stores various types of information required for the operation of the memory controller 2100. The internal memory 2160 may store a plurality of tables. In an embodiment, the internal memory 2160 may store an L2P table in which logical addresses are mapped to physical addresses. In an embodiment, the internal memory 2160 may store a codeword table.

The memory device 2200 may perform a program operation, a read operation, an erase operation, etc. under the control of the memory controller 2100. The memory device 2200 may be implemented as a volatile memory device in which stored data is lost when the supply of power is interrupted or as a nonvolatile memory device in which stored data is retained even when the supply of power is interrupted.

In an embodiment, the memory device 2200 may include a plurality of memory blocks, each having a plurality of pages. Each page may include a plurality of chunks. A single page or a single chunk may be composed of a plurality of program units.

In an embodiment, the memory device 2200 may receive a program command, an address, and a codeword C2 from the memory controller 2100, and may store the codeword C2 in response to the program command and the address. For example, the memory device 2200 may store the partial codeword C1 of the codeword C2 and the second parity part Pα of the codeword C2 in different storage areas in response to the program command and the address. For example, the memory device 2200 may store the partial codeword C1 in a first storage area (e.g., a first page, a first chunk, or a first memory block), and may store the second parity part Pα in a second storage area (e.g., a second page, a second chunk or a second memory block).

In an embodiment, the memory device 2200 may use a partial program scheme when storing the second parity part Pα. For example, the memory device 2200 may store a single second parity part Pα in a single program unit. The second parity part Pα may be received together with the partial codeword C1 or separately from the partial codeword C1.

In an embodiment, the memory device 2200 may receive a program command, an address, a plurality of partial codewords C3, and a parity codeword C5 from the memory controller 2100, and may store the plurality of codewords C3 and the parity codeword C5 in response to the program command and the address. For example, the memory device 2200 may store the plurality of partial codewords C3 and the parity codeword C5 in different storage areas in response to the program command and the address. For example, the memory device 2200 may store the plurality of partial codewords C3 in a first storage area e.g., a first memory block) and store the parity codeword C5 in a second storage area (e.g., a second memory block).

The memory device 2200 may perform a read operation on at least one of the partial codeword C1, the second parity part Pα, the partial codewords C3, or the parity codeword C5 in response to a read command and an address that are received from the memory controller 2100, and may provide respective read values corresponding thereto to the memory controller 2100.

Figure 23:
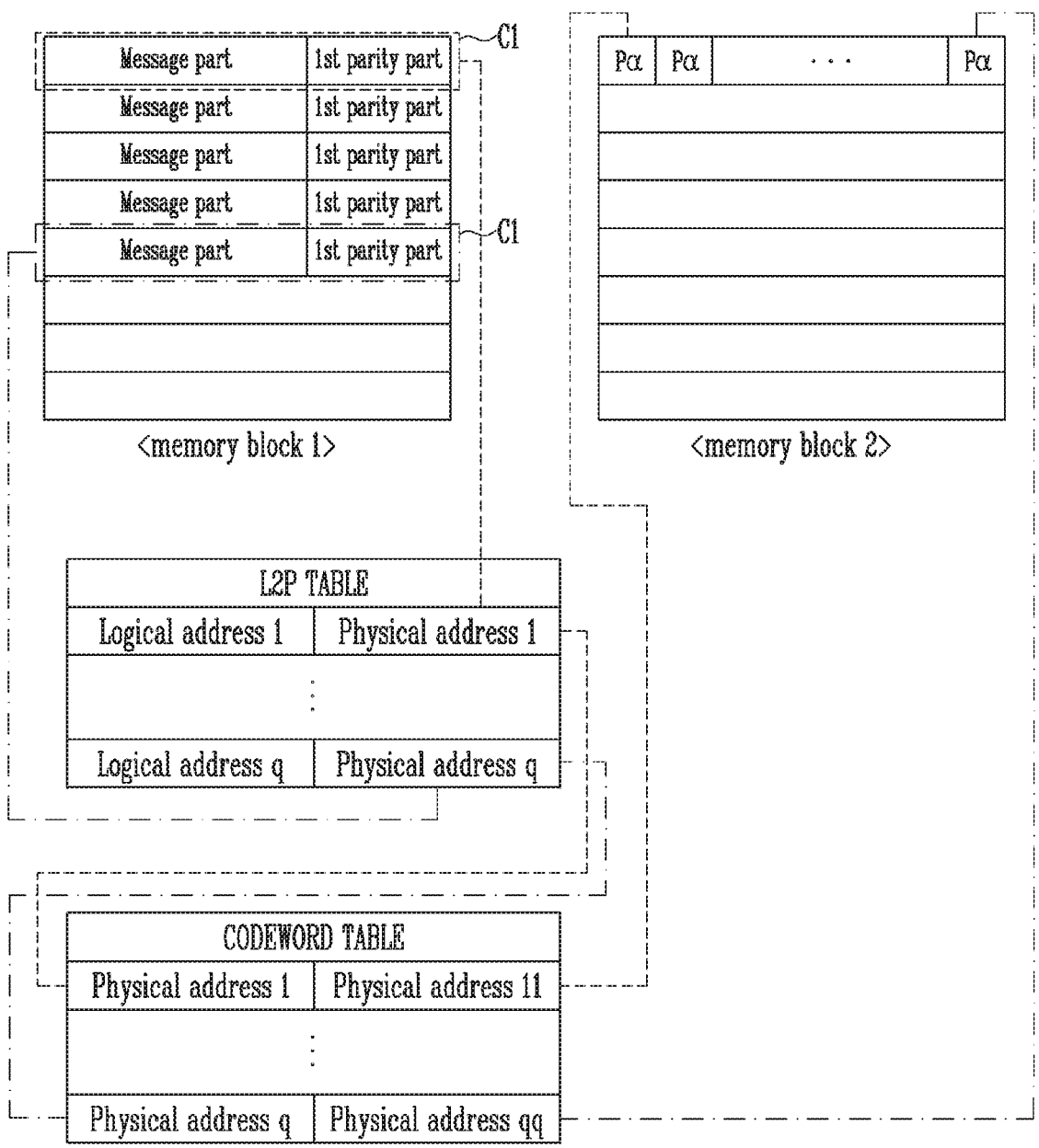
FIG. 23 is an example diagram illustrating tables according to an embodiment of the disclosed technology.

FIG. 23 is an example diagram illustrating tables according to an embodiment of the disclosed technology.

An L2P table may be updated in accordance with physical addresses at which partial codewords C1 are to be stored.

In the embodiment to be described with reference to FIG. 23, a case where partial codewords C1, each composed of a message part and a first parity part ($1^{st}$ parity part), are stored at physical address 1 to physical address q is assumed.

The L2P table may store mapping relationships between logical addresses and physical addresses in accordance with respective partial codewords C1. In FIG. 23, an example is illustrated in which physical address 1 is mapped to logical address 1, and physical address q is mapped to logical address q.

When second parity parts Pα corresponding to partial codewords C1 are stored in the memory device, a codeword table may be updated depending on the addresses at which the second parity parts Pα are stored.

In the embodiment to be described with reference to FIG. 23, a case where second parity parts Pα corresponding to partial codewords C1 are stored at physical address 11 to physical address qq is assumed.

The codeword table may store mapping relationships between physical addresses (which may be logical addresses in some embodiments) at which partial codewords C1 are stored and physical addresses at which second parity parts Pα are stored. In FIG. 23, an example is illustrated in which physical addresses (e.g., physical address 1 to physical address q) at which partial codewords C1 are stored are mapped to physical addresses (e.g., physical address 11 to physical address qq) at which second parity parts Pα are stored.

When first error correction decoding is performed at a first code rate of k/n, the L2P table may be referred to, and then the corresponding codeword C1 may be read.

When second error correction decoding is performed at a second code rate of k/(n+α), the codeword table may be further referred to, and then a second parity part Pα corresponding to the partial codeword C1 may be read. That is, the physical address at which the second parity part Pα corresponding to the partial codeword C1 is stored may be derived from the codeword table, and the second parity part Pα may be read from the derived physical address.

Although a case where partial codewords C1 and second parity parts Pα corresponding to the partial codewords C1 are stored in different memory blocks (e.g., memory block 1 and memory block 2) is illustrated in FIG. 23 as an example, the embodiments of the disclosed technology are not limited thereto. For example, the partial codewords C1 and the second parity parts Pα may be stored in the same memory block.

Figure 24:
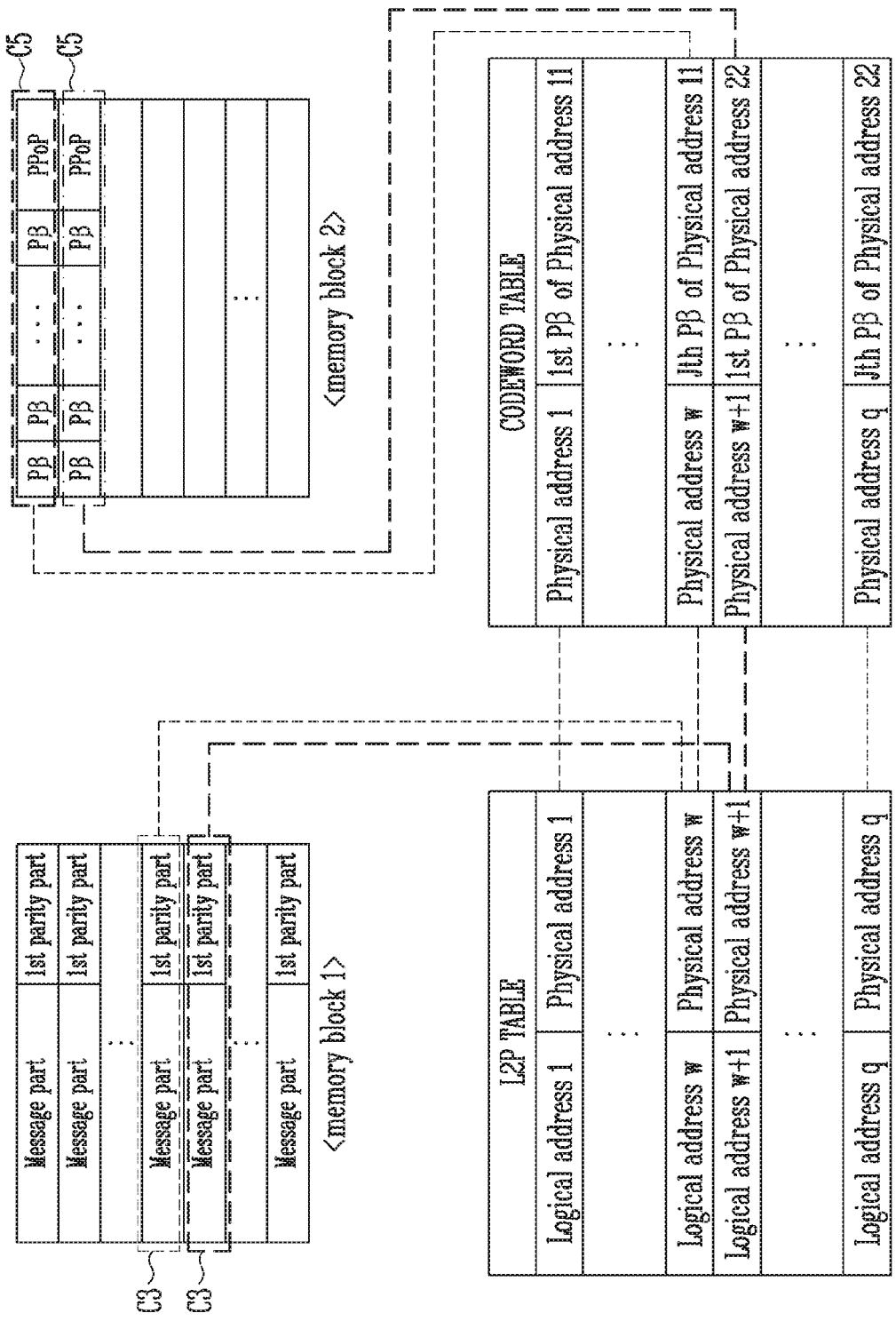
FIG. 24 is an example diagram illustrating a codeword table according to an embodiment of the disclosed technology.

FIG. 24 is an example diagram illustrating a codeword table according to an embodiment of the disclosed technology.

An L2P table may be updated in accordance with physical addresses at which partial codewords C3 are to be stored.

In the embodiment to be described with reference to FIG. 24, a case where partial codewords C3, each composed of a message part and a first parity part ($1^{st}$ parity part), are stored at physical address 1 to physical address q is assumed.

The L2P table may store mapping relationships between logical addresses and physical addresses in accordance with respective partial codewords C3. In FIG. 24, an example is illustrated in which physical address 1 is mapped to logical address 1, and physical address q is mapped to logical address q.

When the parity codeword C5 corresponding to a plurality of partial codewords C3 is stored in the memory device, the codeword table may be updated depending on the address at which the parity codeword C5 is stored.

In the embodiment to be described with reference to FIG. 24, a case where parity codewords C5 corresponding to partial codewords C3 are stored at physical address 11 to physical address 22 is assumed.

The codeword table may store mapping relationships between physical addresses (which may be logical addresses in some embodiments) at which the partial codewords C3 are stored and physical addresses at which parity codewords C5 corresponding to the partial codewords C3 are stored. In FIG. 24, an example is illustrated in which physical addresses (e.g., physical address 1 to physical address w) at which partial codewords C3 are stored are mapped to physical address (e.g., physical address 11) at which the parity codewords C5 are stored. Further, in FIG. 24, an example is illustrated in which physical addresses (e.g., physical address w+1 to physical address q) at which partial codewords C3 are stored are mapped to a physical address (e.g., physical address 22) at which a parity codeword C5 is stored.

The codeword table may further store mapping relationships between partial codewords C3 and a plurality of second parity parts Pβ included in a parity codeword C5 corresponding to the partial codewords C3. For example, the codeword table may store information about a sequence number of a second parity part Pβ corresponding to a certain partial codeword C3, among a plurality of second parity parts Pβ included in the parity codeword. C5. In FIG. 24, an example is illustrated in which a j-th second parity part Pβ, among a plurality of second parity parts Pβ included in the parity codeword C5 stored at physical address 11, is mapped to the partial codeword C3 stored at the physical address w. Also, in FIG. 24, an example is illustrated in which a $1^{st}$ second parity part (i.e., $1^{st}$ Pβ), among a plurality of second parity parts Pβ included in the parity codeword C5 stored at physical address 22, is mapped to the partial codeword C3 stored at the physical address w+1.

When first error correction decoding is performed at a first code rate of k/n, the L2P table may be referred to, and then the corresponding codeword C3 may be read.

When third error correction decoding is performed at a third code rate of k/(n+β), the codeword table may be additionally referred to. As described above, third error correction decoding may include first sub-error correction decoding and second sub-error correction decoding.

When first sub-error correction decoding is performed, the codeword table may be referred to, and then a parity codeword C5 corresponding to a partial codeword C3 may be read. That is, the physical address at which the parity codeword C5 corresponding to the partial codeword C3 is stored may be derived from the codeword table, and the parity codeword C5 may be read from the derived physical address.

When second sub-error correction decoding is performed, the codeword table may be referred to, and thus a second parity part Pβ corresponding to a partial codeword C3 or a read value Rβ corresponding to the partial codeword C3 may be selected. For example, when first sub-error correction decoding passes, the codeword table may be referred to, and thus a second parity part Pβ corresponding to the partial codeword C3 may be selected from the parity codeword C5. For example, when first sub-error correction decoding fails, the codeword table may be referred to, and thus a read value Rβ corresponding to the partial codeword C3 may be selected from read values R5.

Although a case where partial codewords C3 and a parity codeword C5 corresponding to the partial codewords C3 are stored in different memory blocks (e.g., memory block 1 and memory block 2) is illustrated in FIG. 24 as an example, the embodiments of the disclosed technology are not limited thereto. For example, the partial codewords C3 and the parity codeword C5 may be stored in the same memory block.

Figure 25:
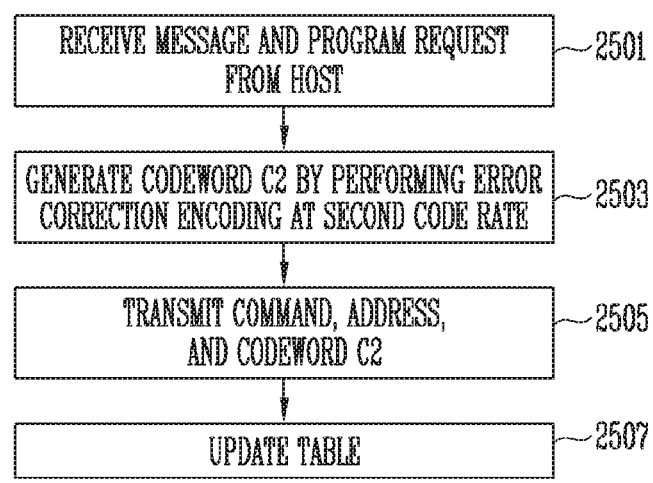
FIG. 25 is a flowchart illustrating a process in which the memory controller of FIG. 22 performs error correction encoding.

FIG. 25 is a flowchart illustrating a process in which the memory controller of FIG. 22 performs error correction encoding.

In an embodiment to be described with reference to FIG. 25, a case where additional error correction encoding is not performed on second parity parts Pα is described. Further, in the embodiment to be described with reference to FIG. 25, a case where a partial program scheme is used so as to store the second parity parts Pα is assumed.

At step 2501, the memory controller k-bit message and a program request that requests to program the k-bit message from a host.

At step 2503, the memory controller may generate an n+α-bit codeword C2 by performing error correction encoding on the k-bit message at a second code rate. The codeword C2 may include an n-bit partial codeword C1 and an α-bit second parity part Pα. The n-bit partial codeword C1 may include a k-bit message part and an n−k-bit first parity part.

At step 2505, the memory controller may generate a command and an address for storing the codeword C2, and may transmit the generated command and address and the codeword C2 to the memory device. Here, the memory controller may generate the command and the address so that the partial codeword C1 and the second parity part Pα are stored in different storage areas (e.g., different chunks, different pages or different memory blocks).

At step 2507, the memory controller may update at least one of an L2P table or a codeword table in response to the address generated at step 2505.

Figure 26:
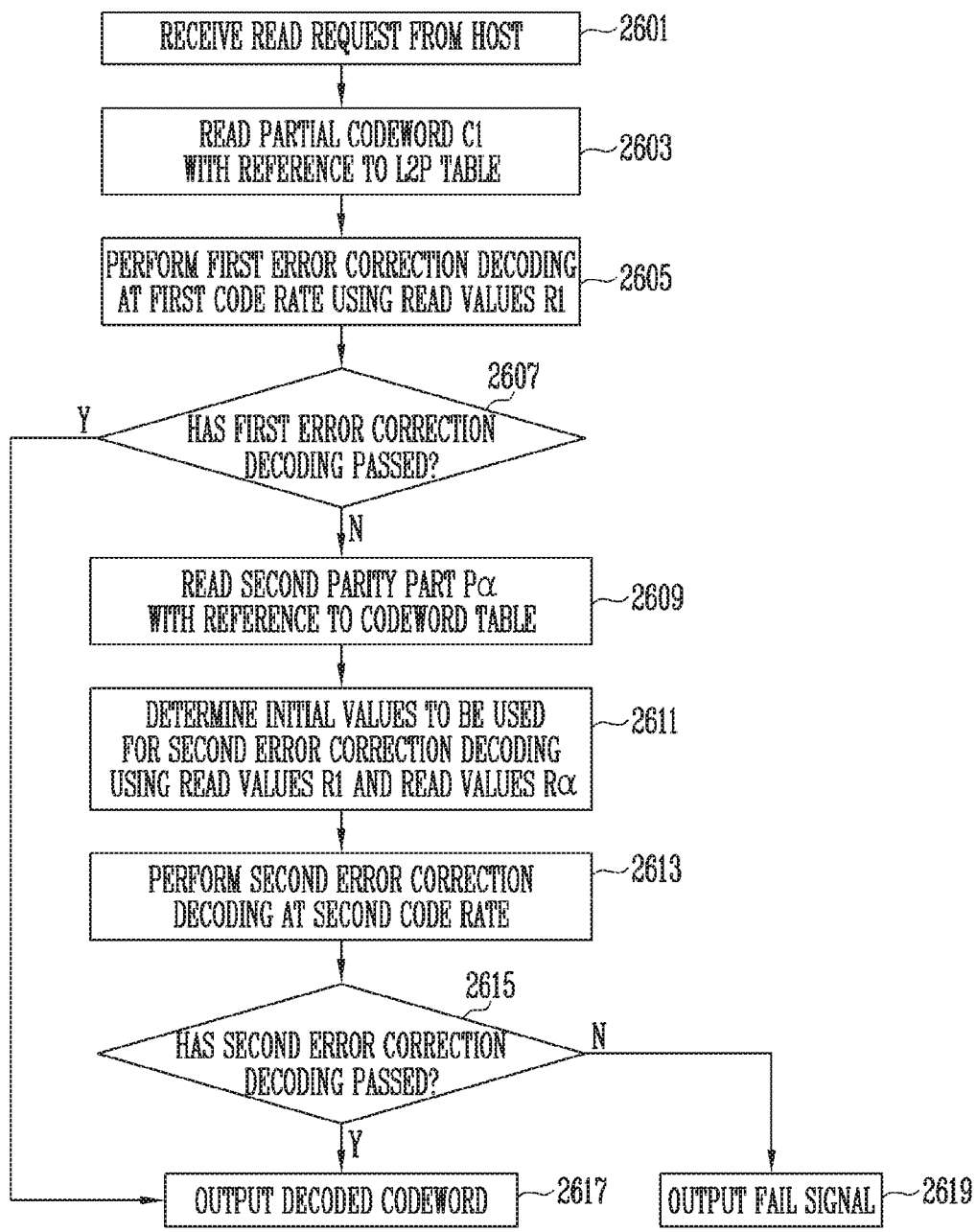
FIG. 26 is a flowchart illustrating a process in which the memory controller of FIG. 22 performs error correction decoding.

FIG. 26 is a flowchart illustrating a process in which the memory controller of FIG. 22 performs error correction decoding.

In an embodiment to be described with reference to FIG. 26, a case where additional error correction encoding is not performed on a second parity part Pα is assumed.

At step 2601, the memory controller may receive a read request from the host. The read request may include a logical address.

At step 2603, the memory controller may check a physical address corresponding to a logical address requested by the host to be read with reference to an L2P table, and may read a partial codeword C1 from the checked physical address.

At step 2605, the memory controller may perform first error correction decoding at a first code rate. For example, the memory controller may perform first error correction decoding using a first parity check matrix H1 having a size of (n−k)×n and n-bit read values R1 corresponding to the partial codeword C1.

At step 2607, the memory controller may determine whether first error correction decoding has passed. For example, the memory controller may determine whether a valid codeword that satisfies constraints for the first parity check matrix H1 has been generated within the maximum number of iterations (i.e., the maximum iteration number).

When it is determined at step 2607 that first error correction decoding has passed (in case of Y), the process proceeds to step 2617 to output a decoded codeword.

When it is determined at step 2607 that first error correction decoding has failed (in case of N), the process may proceed to step 2609.

At step 2609, the memory controller may check a physical address at which a second parity part Pα corresponding to the partial codeword C1 is stored, with reference to a codeword table. The memory controller may read the second parity part Pα from the checked physical address.

At step 2611, the memory controller may determine initial values to be used for second error correction decoding using read values R1 corresponding to the partial codeword C1 and read values Rα corresponding to the second parity part Pα.

At step 2613, the memory controller may perform second error correction decoding at a second code rate. For example, the memory controller may perform second error correction decoding using a second parity check matrix H2 having a size of (n−k+α)×(n+α) and the initial values determined at step 2611.

At step 2615, the memory controller may determine whether second error correction decoding has passed. For example, the memory controller may determine whether a valid codeword that satisfies constraints for the second parity check matrix H2 has been generated within the maximum iteration number.

When it is determined at step 2615 that second error correction decoding has passed (in case of Y), the process proceeds to step 2617 to output a decoded codeword.

When it is determined at step 2615 that second error correction decoding has failed, the process proceeds to step 2619 where a fail signal indicating that error correction decoding has failed may be output.

Figure 27:
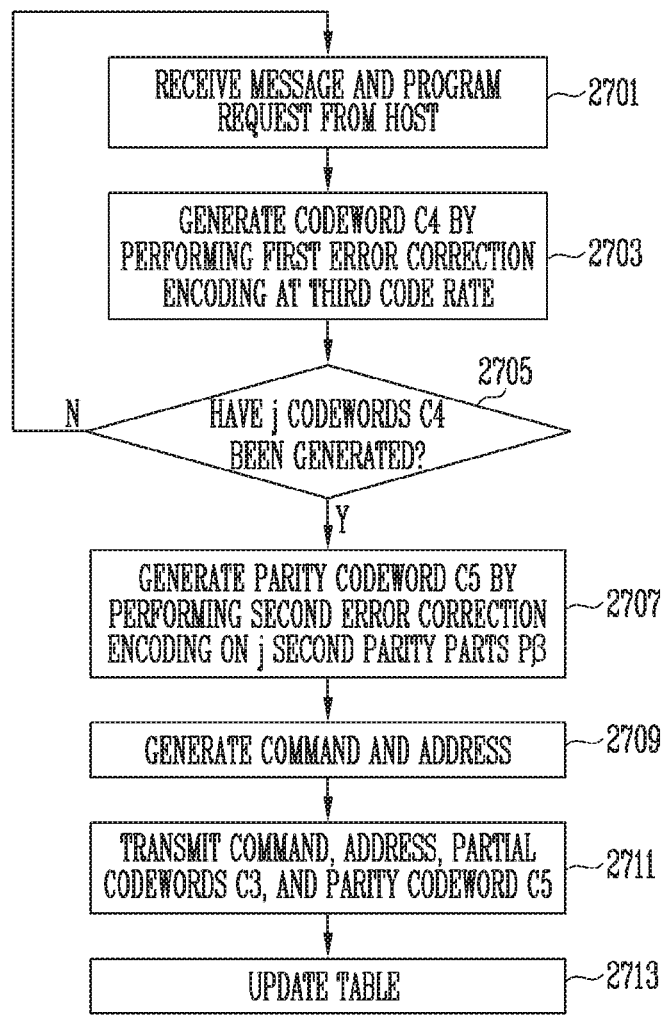
FIG. 27 is a flowchart illustrating a process in which the memory controller of FIG. 22 performs error correction encoding.

FIG. 27 is a flowchart illustrating a process in which the memory controller of FIG. 22 performs error correction encoding.

In an embodiment to be described with reference to FIG. 27, a case where additional error correction encoding is performed on second parity parts Pβ will be described.

At step 2701, the memory controller may receive a k-bit message and a program request that requests to program the k-bit message from a host.

At step 2703, the memory controller may generate an n+β-bit codeword C4 by performing first error correction encoding on the k-bit message at a third code rate of k/(n+β). The codeword C4 may include an n-bit partial codeword C3 and a β-bit second parity part Pβ.

At step 2705, the memory controller may determine whether a set number of codewords C4 have been generated. For example, the memory controller may determine whether j codewords C4 have been generated. When it is determined at step 2705 that the j codewords C4 have been generated (in case of Y), the process may proceed to step 2707, otherwise (in case of N) the process may return to step 2701.

At step 2707, the memory controller may generate an n-bit parity codeword C5 by performing second error correction encoding on j second parity parts Pβ corresponding to j partial codewords C3. The n-bit parity codeword. C5 may include a u-bit second parity part area Pβsa and a n–u-bit third parity part PPoP.

At step 2709, the memory controller may generate a command and an address for storing a plurality of partial codewords C3 and the parity codeword C5. Here, the memory controller may generate the command and the address so that the plurality of partial codewords C3 and the parity codeword C5 are stored in different storage areas (e.g., different chunks, different pages or different memory blocks).

At step 2711, the memory controller may generate the command, the address, the partial codewords C3, and the parity codeword C5 to the memory device.

At step 2713, the memory controller may update at least one of an UP table or a codeword table in response to the address generated at step 2709.

Figure 28:
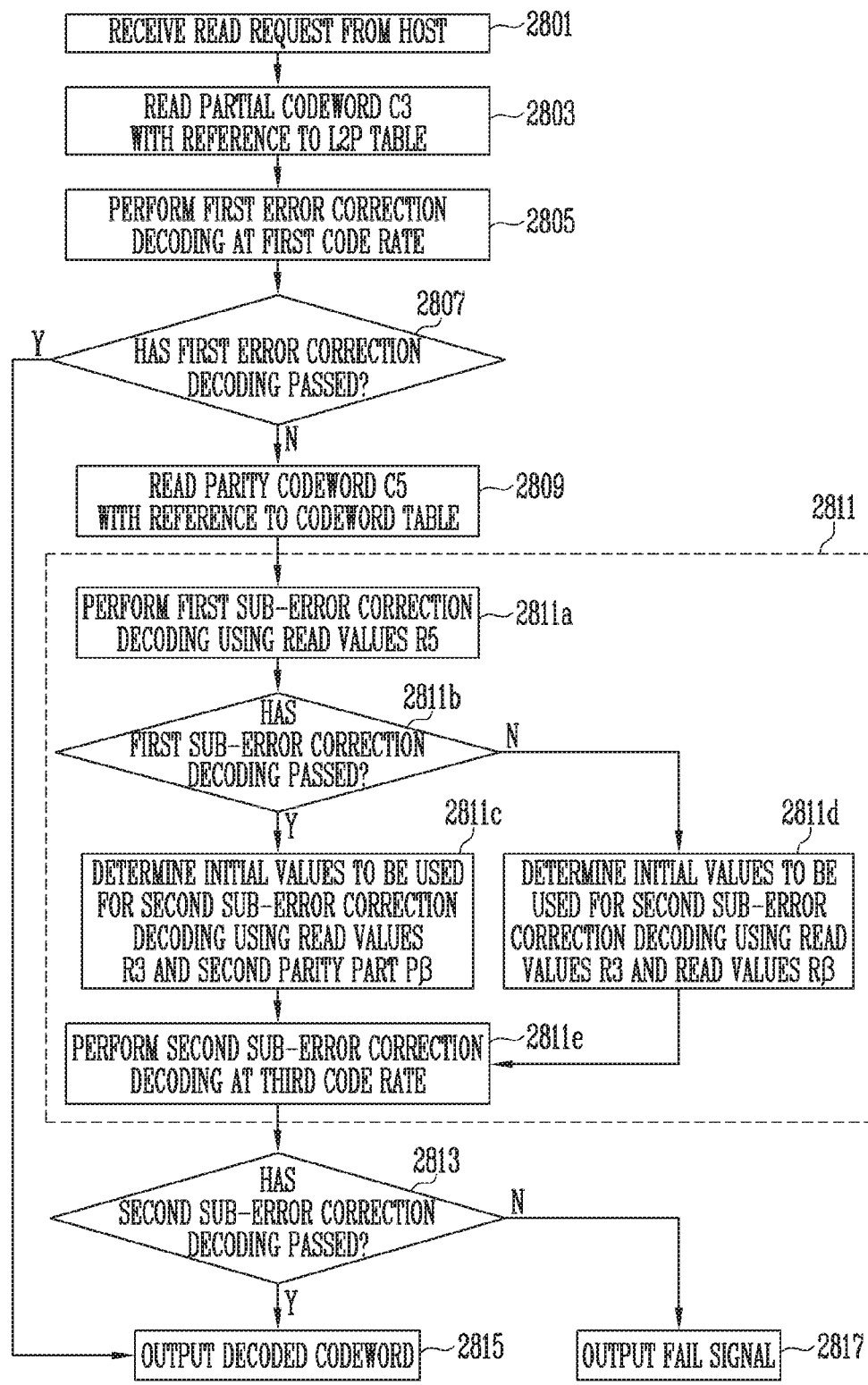
FIG. 28 is a flowchart illustrating a process in which the memory controller of FIG. 22 performs error correction decoding.

FIG. 28 is a flowchart illustrating a process in which the memory controller of FIG. 22 performs error correction decoding.

In an embodiment to be described with reference to FIG. 28, a case where additional error correction encoding is performed on a plurality of second parity parts Pβ is assumed.

At step 2801, the memory controller may receive a read request from a host. The read request may include a logical address.

At step 2803, the memory controller may check a physical address corresponding to a logical address requested by the host to be read with reference to an L2P table, and may read a partial codeword C3 from the checked physical address.

At step 2805, the memory controller may perform first error correction decoding at a first code rate. For example, the memory controller may perform first error correction decoding using a first parity check matrix H1 having a size of (n–k)×n and n-bit read values R3 corresponding to the partial codeword C3.

At step 2807, the memory controller may determine whether first error correction decoding has passed. For example, the memory controller may determine whether a valid codeword that satisfies constraints for the first parity check matrix H1 has been generated within the maximum iteration number.

When it is determined at step 2807 that first error correction decoding has passed (in case of Y), the process proceeds to step 2815 to output a decoded codeword.

When it is determined at step 2807 that first error correction decoding has failed, the process may proceed to step 2809.

At step 2809, the memory controller may check a physical address at which a parity codeword C5 corresponding to the partial codeword C3 is stored with reference to a codeword table. The memory controller may read the parity codeword C5 from the checked physical address.

At step 2811, the memory controller may perform third error correction decoding at a third code rate. Step 2811 may include steps 2811a to 2811e.

At step 2811a, the memory controller may perform first sub-error correction decoding using read values R5 corresponding to the parity codeword C5. For example, the memory controller may perform first sub-error correction decoding using a fourth parity check matrix H4 having a size of (n–u)×n and n-bit read values R5.

At step 2811b, the memory controller may determine whether first sub-error correction decoding has passed. For example, the memory controller may determine whether a valid codeword that satisfies constraints for the fourth parity check matrix H4 has been generated within the maximum iteration number.

When it is determined at step 2811b that first sub-error correction decoding has passed (in case of Y), the process may proceed to step 2811c, otherwise (in case of N) the process may proceed to step 2811d.

At step 2811c which is performed when first sub-error correction decoding has passed, the memory controller may determine initial values to be used for second sub-error correction decoding using the read values R3 corresponding to the partial codeword C3 and a second parity part Pβ corresponding to the partial codeword C3. Here, the memory controller may select the second parity part Pβ corresponding to the partial codeword C3 from a plurality of second parity parts Pβ included in the decoded parity codeword C5.

At step 2811d which is performed when first sub-error correction decoding has failed, the memory controller may determine initial values to be used for second sub-error correction decoding using the read values R3 corresponding to the partial codeword C3 and read values Rβ corresponding to the second parity part Pβ. Here, the memory controller may select the read values Rβ corresponding to the partial codeword C3 from a plurality of read values Rβ included in the read values R5 corresponding to the parity codeword C5.

At step 2811e, the memory controller may perform second sub-error correction decoding at a third code rate. For example, the memory controller may perform second sub-error correction decoding using a third parity check matrix H3 having a size of (n–k+β)×(n+β) and the initial values determined at step 2811c or 2811d.

At step 2813, the memory controller may determine whether second sub-error correction decoding has passed. For example, the memory controller may determine whether a valid codeword that satisfies constraints for the third parity check matrix H3 has been generated within the maximum iteration number.

When it is determined at step 2813 that second sub-error correction decoding has passed (in case of Y), the process proceeds to step 2815 to output a decoded codeword.

When it is determined at step 2813 that second sub-error correction decoding has failed, the process proceeds to step 2817 where a fail signal indicating that error correction decoding has failed may be output.

Figure 29:
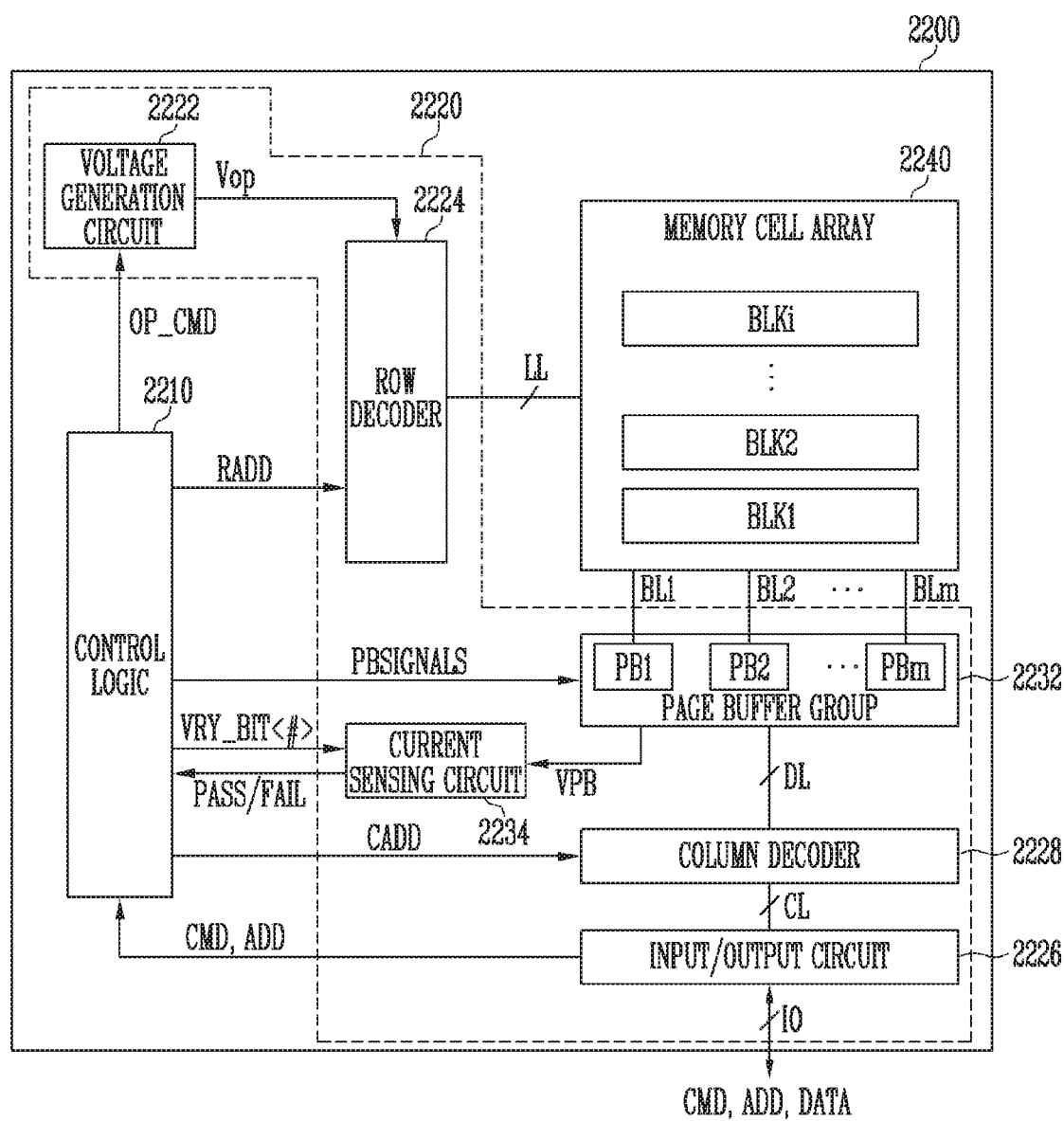
FIG. 29 is a diagram illustrating a memory device according to an embodiment of the disclosed technology.

FIG. 29 is a diagram illustrating a memory device according to an embodiment of the disclosed technology. The memory device illustrated in FIG. 29 may be applied to the memory system illustrated in FIG. 22.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 22.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PL1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 30:
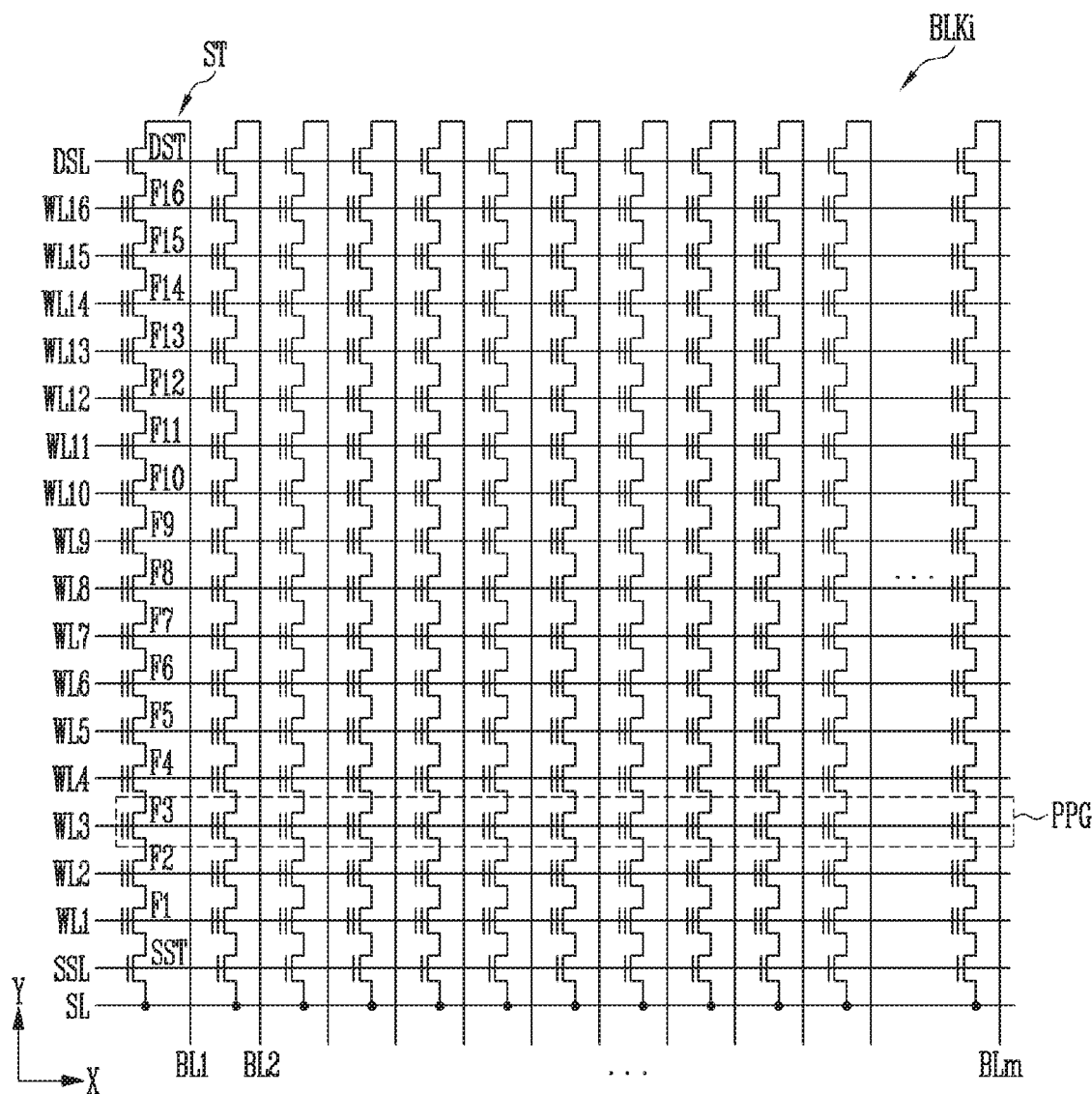
FIG. 30 is an example diagram illustrating a memory block.

FIG. 30 is an example diagram illustrating a memory block.

A memory cell array may include a plurality of memory blocks, and any one memory block BLKi of the plurality of memory blocks is illustrated in FIG. 30 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG. The data corresponding to one logical page LPG may include a number of data bits identical to the number of cells included in one physical page PPG. For example, when two or more bits of data are stored in one memory cell, one physical page PPG may store data corresponding to two or more logical pages LPG For example, in a memory device driven in an VILE type, data corresponding to two logical pages may be stored in one physical page PPG In a memory device driven in a TLC type, data corresponding to three logical pages may be stored in one physical page PPG.

Figure 31:
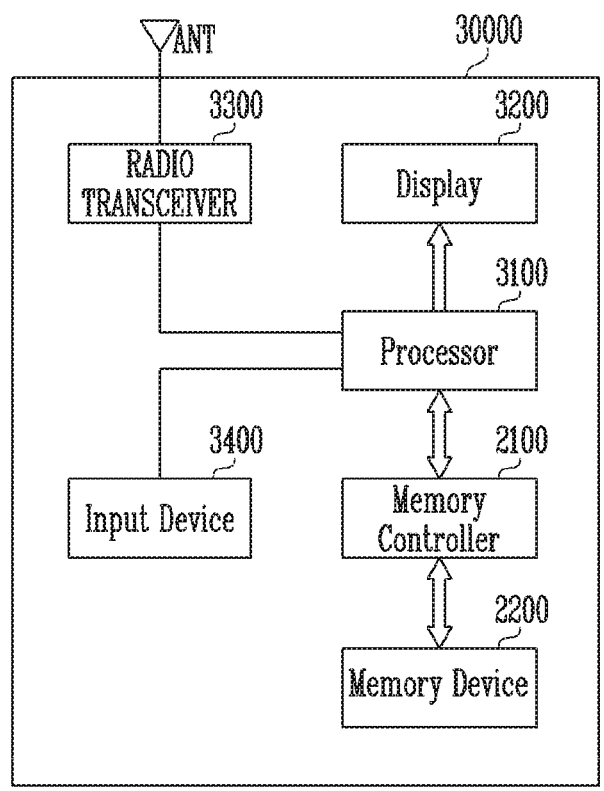
FIG. 31 shows a diagram illustrating an embodiment of a memory system including the memory controller of FIG. 22.

FIG. 31 is a diagram illustrating an embodiment of a memory system including the memory controller of FIG. 22.

Referring to FIG. 31, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna. ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by e processor 3100 to the memory device 2200. Furthermore, the radio transceiver 3300 may change a signal output from the processor 3100 into a radio signal, and output the changed radio signal to the external device through the antenna ANT An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 32:
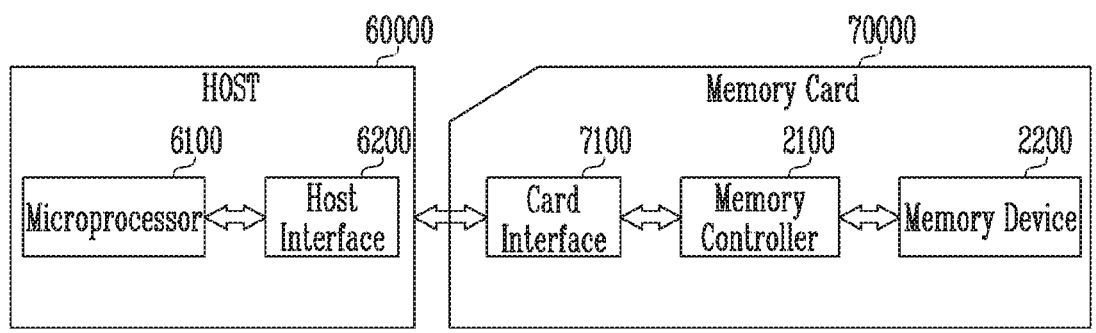
FIG. 32 shows a diagram illustrating another embodiment of a memory system including the memory controller of FIG. 22.

FIG. 32 is a diagram illustrating an embodiment of a memory system including the memory controller of FIG. 22.

Referring to FIG. 32, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor 6100.

In accordance with the disclosed technology, a code rate can be varied when error correction decoding is performed.

In accordance with the disclosed technology, the performance of error correction decoding may be improved while a change in the design of a memory system that is conventionally used is minimized.

While the exemplary embodiments of the disclosed technology have been disclosed for illustrative purposes, those skilled in the art will appreciate that various modifications, additions and substitutions are possible. Therefore, the scope of the disclosed technology must be defined by the appended claims and equivalents of the claims.

What is claimed is:

1. A memory controller for controlling a memory device, comprising:
    an error correction encoder configured to encode a message at a second code rate and generate a codeword including i) a partial codeword including a message part and a first parity part, and ii) a second parity part, wherein the first parity part and the second parity part are determined based on a size of the message part and a size of a program unit for writing data in the memory device; and
    an error correction decoder configured to perform, in response to a failure of a first error correction decoding operation by the error correction decoder using a first parity check matrix on first read values corresponding to the partial codeword, a second error correction decoding operation using a second parity check matrix on second read values corresponding to the codeword,
    wherein a first code rate corresponding to the first parity check matrix is higher than the second code rate corresponding to the second parity check matrix.

2. The memory controller according to claim 1, further comprising a central processing unit configured to generate a command and an address, and output the command and the address to a memory device, the command instructing the partial codeword to be stored in a first storage area of the memory device and the second parity part to be stored in a second storage area of the memory device.

3. The memory controller according to claim 2, wherein the central processing unit is configured to generate and output the command and the address when the codeword is generated.

4. The memory controller according to claim 1, wherein the first parity check matrix is a subset of the second parity check matrix.

5. The memory controller according to claim 4, wherein all entries of the second parity check matrix that are outside of the first parity check matrix and disposed in rows included in the first parity check matrix are 0.

6. The memory controller according to claim 1, wherein the error correction decoder comprises a mapper configured to determine, for the first error correction decoding operation, log likelihood ratio (LLR) values to be assigned to variable nodes corresponding to the first parity check matrix based on the first read values, and determine, for the second error correction decoding operation, another LLR values to be assigned to variable nodes corresponding to the second parity check matrix based on the second read values.

7. The memory controller according to claim 1, wherein:
the error correction encoder and the error correction decoder use a low-density parity check (LDPC) code.

8. The memory controller according to claim 1, wherein the program unit is a page or a chunk.

9. A memory controller, comprising:
an error correction encoder configured to perform a first error correction encoding operation on a plurality of messages at a second code rate and generate, in the first error correction encoding operation, a plurality of codewords, each codeword corresponding to one of the plurality of messages and including a i) partial codeword including a message part and a first parity part, and a second parity part, the error correction encoder further configured to perform a second error correction encoding operation on second parity parts of the plurality of codewords and generate a parity codeword corresponding one of to the plurality of codewords in the second error correction encoding operation; and
an error correction decoder configured to perform second error correction decoding operation using a second parity check matrix on a target codeword that is selected from the plurality of codewords and includes the partial codeword including the message part and the first parity part, in response to a failure of first error correction decoding operation using a first parity check matrix on the partial codeword of the target codeword, and
wherein a first code rate corresponding to the first parity check matrix is higher than the second code rate corresponding to the second parity check matrix.

10. The memory controller according to claim 9, further comprising a central processing unit configured to generate a command and an address and output the command and the address to a memory device, the command instructing partial codewords included in the plurality of codewords, each partial codeword including the message part and the first parity part, to be stored in a first storage area of the memory device and the parity codeword to be stored in a second storage area of the memory device.

11. The memory controller according to claim 9, wherein the error correction decoder is configured to receive first read values corresponding to the partial codeword of the target codeword and perform the first error correction decoding operation using the first read values and further configured, upon a failure of the first error correction decoding operation, to receive second read values corresponding to the parity codeword and perform the second error correction decoding operation using the first read values and the second read values.

12. The memory controller according to claim 11, wherein the second error correction decoding operation comprises:
first sub-error correction decoding operation and second sub-error correction decoding operation,
wherein the first sub-error correction decoding operation is performed based on the second read values, and
wherein the second sub-error correction decoding is performed using log likelihood ratio (LLR) values corresponding to the target codeword,
wherein the LLR values are determined based on whether the first sub-error correction decoding operation fails.

13. The memory controller according to claim 12, wherein the error correction decoder comprises:
a decoding controller configured to select read values corresponding to a second parity part of the target codeword among the second read values in response to a failure of the first sub-error correction decoding operation; and
a mapper configured to determine the LLR values using the selected read values and the first read values.

14. The memory controller according to claim 12, wherein the error correction decoder comprises:
a decoding controller configured to select a second parity part of the target codeword included in first sub-error correction-decoded parity codeword in response to a success of the first sub-error correction decoding operation;
a mapper configured to determine the LLR values using the selected second parity part and the first read values; and
a node processor configured to perform at least one iteration within a maximum iteration number based on an iterative decoding scheme using the LLR values.

15. The memory controller according to claim 14, wherein the mapper is configured to determine second LLR values corresponding to the selected second parity part to have a largest value among the LLR values.

16. The memory controller according to claim 14, wherein the node processor comprises:
a variable node update module configured to generate variable-to-check (V2C) messages and update values of the variable nodes, based on the LLR values and check-to-variable (C2V) messages; and
a check node update module configured to generate the C2V messages based on the V2C messages received from the variable node update module and send the C2V messages to the variable node update module,
wherein V2C messages from variable nodes corresponding to the second parity part are determined based on LLR values assigned to the variable nodes corresponding to the second parity part, regardless of the C2V messages.

17. The memory controller according to claim 16, wherein values of the variable nodes corresponding to the second parity part are fixed.

18. The memory controller according to claim 9, wherein the first parity check matrix is a subset of the second parity check matrix.

19. The memory controller according to claim 18, wherein all entries of the second parity check matrix and outside of the first parity check matrix and disposed in rows included in the first parity check matrix are 0.

20. The memory controller according to claim 9, wherein:
the error correction encoder and the error correction decoder use a low-density parity check (LDPC) code.

* * * * *